(12) United States Patent
Lin et al.

(10) Patent No.: US 8,304,292 B1
(45) Date of Patent: Nov. 6, 2012

(54) METHOD OF MAKING A SEMICONDUCTOR CHIP ASSEMBLY WITH A CERAMIC/METAL SUBSTRATE

(75) Inventors: Charles W. C. Lin, Singapore (SG); Chia-Chung Wang, Hsinchu (TW)

(73) Assignee: Bridge Semiconductor Corporation, Taipei (TW)

( * ) Notice: Subject to any disclaimer, the term of this patent is extended or adjusted under 35 U.S.C. 154(b) by 357 days.

(21) Appl. No.: 12/849,018

(22) Filed: Aug. 3, 2010

Related U.S. Application Data

(62) Division of application No. 12/848,176, filed on Aug. 1, 2010.

(60) Provisional application No. 61/231,686, filed on Aug. 6, 2009.

(51) Int. Cl.
- H01L 21/50 (2006.01)
- H01L 21/56 (2006.01)
- H01L 21/58 (2006.01)

(52) U.S. Cl. ............ 438/122; 438/124; 438/26

(58) Field of Classification Search .......... 438/26, 438/121, 122, 124, 116; 257/E21.499
See application file for complete search history.

(56) References Cited

U.S. PATENT DOCUMENTS

| | | | |
|---|---|---|---|
| 3,689,993 A | 9/1972 | Tolar | 438/380 |
| 3,969,199 A | 7/1976 | Berdan et al. | 205/177 |
| 4,420,767 A | 12/1983 | Hodge et al. | 257/713 |
| 4,509,096 A | 4/1985 | Baldwin et al. | 257/706 |
| 5,012,386 A | 4/1991 | McShane et al. | 361/386 |
| 5,102,829 A | 4/1992 | Cohn | 437/217 |
| 5,379,187 A | 1/1995 | Lee et al. | 361/707 |
| 5,457,605 A | 10/1995 | Wagner et al. | 361/720 |
| 5,543,586 A | 8/1996 | Crane, Jr. et al. | 174/262 |
| 5,644,163 A | 7/1997 | Tsuji | 257/706 |
| 5,991,156 A | 11/1999 | Bond et al. | 361/707 |
| 6,057,601 A | 5/2000 | Lau et al. | 257/738 |
| 6,107,683 A | 8/2000 | Castro et al. | 257/700 |
| 6,123,998 A | 9/2000 | Takahashi et al. | 427/446 |
| 6,160,705 A | 12/2000 | Stearns et al. | 361/704 |
| 6,162,664 A | 12/2000 | Kim | 438/126 |
| 6,281,568 B1 | 8/2001 | Glenn et al. | 257/684 |
| 6,313,525 B1 | 11/2001 | Sasano | 257/704 |
| 6,453,549 B1 | 9/2002 | Bhatt et al. | 29/837 |
| 6,495,914 B1 | 12/2002 | Sekine et al. | 257/723 |
| 6,498,355 B1 | 12/2002 | Harrah et al. | 257/99 |
| 6,507,102 B2 | 1/2003 | Juskey et al. | 257/406 |
| 6,518,502 B2 | 2/2003 | Hammond et al. | 174/52.4 |
| 6,528,882 B2 | 3/2003 | Ding et al. | 257/738 |
| 6,541,832 B2 | 4/2003 | Coyle | 257/415 |
| 6,583,444 B2 | 6/2003 | Fjelstad | 257/82 |
| 6,603,209 B1 | 8/2003 | DiStefano et al. | 257/781 |
| 6,608,376 B1 | 8/2003 | Liew et al. | 257/698 |

(Continued)

FOREIGN PATENT DOCUMENTS

JP  2005-166775  6/2005

*Primary Examiner* — Mary Wilczewski
(74) *Attorney, Agent, or Firm* — Jackson IPG PLLC

(57) ABSTRACT

A method of making a semiconductor chip assembly includes providing a metal plate, providing a ceramic block in the metal plate, providing an insulative material in the metal plate, wherein the metal plate includes a base and a terminal, then providing a conductive layer on the base and the ceramic block, providing a conductive trace that includes a pad, the terminal and a selected portion of the conductive layer, then mounting a semiconductor device on the ceramic block, wherein a heat spreader includes the base and the ceramic block, electrically connecting the semiconductor device to the conductive trace and thermally connecting the semiconductor device to the heat spreader.

20 Claims, 24 Drawing Sheets

U.S. PATENT DOCUMENTS

| | | | |
|---|---|---|---|
| 6,625,028 B1 | 9/2003 | Dove et al. | 361/707 |
| 6,670,219 B2 | 12/2003 | Lee et al. | 438/107 |
| 6,683,795 B1 | 1/2004 | Yoo | 361/816 |
| 6,690,087 B2 | 2/2004 | Kobayashi et al. | 257/686 |
| 6,720,651 B2 | 4/2004 | Gaku et al. | 257/707 |
| 6,744,135 B2 | 6/2004 | Hasebe et al. | 257/712 |
| 6,861,750 B2 | 3/2005 | Zhao et al. | 257/739 |
| 6,900,535 B2 | 5/2005 | Zhao | 257/707 |
| 6,906,414 B2 | 6/2005 | Zhao et al. | 257/707 |
| 6,936,855 B1 | 8/2005 | Harrah | 257/88 |
| 6,964,877 B2 | 11/2005 | Chen et al. | 438/20 |
| 7,038,311 B2 | 5/2006 | Woodall et al. | 257/706 |
| 7,055,574 B2 | 6/2006 | Stangman et al. | 164/138 |
| 7,196,403 B2 | 3/2007 | Karim | 257/675 |
| 7,335,522 B2 | 2/2008 | Wang et al. | 438/26 |
| 7,348,493 B2 | 3/2008 | Osanai et al. | 174/256 |
| 7,470,935 B2 | 12/2008 | Lee et al. | 257/98 |
| 7,495,322 B2 | 2/2009 | Hashimoto et al. | 257/676 |
| 7,582,951 B2 | 9/2009 | Zhao et al. | 257/660 |
| 7,642,137 B2 | 1/2010 | Lin et al. | 438/127 |
| 7,690,817 B2 | 4/2010 | Sanpei et al. | 362/294 |
| 7,741,158 B2 | 6/2010 | Leung et al. | 438/122 |
| 7,781,266 B2 | 8/2010 | Zhao et al. | 438/123 |
| 7,808,087 B2 | 10/2010 | Zhao et al. | 257/670 |
| 7,812,360 B2 | 10/2010 | Yano | 257/98 |
| 7,956,372 B2 | 6/2011 | Kamada et al. | 257/98 |
| 8,030,676 B2 | 10/2011 | Lin | 257/99 |
| 8,071,998 B2 | 12/2011 | Chen | 257/99 |
| 2003/0189830 A1 | 10/2003 | Sugimoto et al. | 362/294 |
| 2004/0061433 A1 | 4/2004 | Izuno et al. | 313/498 |
| 2004/0065894 A1 | 4/2004 | Hashimoto et al. | 257/100 |
| 2005/0024834 A1 | 2/2005 | Newby | 361/719 |
| 2005/0135105 A1 | 6/2005 | Teixeira et al. | 362/294 |
| 2005/0185880 A1 | 8/2005 | Asai | 385/14 |
| 2005/0274959 A1 | 12/2005 | Kim et al. | 257/79 |
| 2006/0012967 A1 | 1/2006 | Asai et al. | 361/764 |
| 2006/0054915 A1 | 3/2006 | Chang | 257/100 |
| 2006/0109632 A1 | 5/2006 | Berlin et al. | 361/719 |
| 2006/0131735 A1 | 6/2006 | Ong et al. | 257/706 |
| 2007/0063213 A1 | 3/2007 | Hsieh et al. | 257/99 |
| 2007/0077416 A1 | 4/2007 | Ito et al. | 428/339 |
| 2007/0090522 A1 | 4/2007 | Alhayek et al. | 257/723 |
| 2007/0252166 A1 | 11/2007 | Chang et al. | 257/98 |
| 2007/0267642 A1 | 11/2007 | Erchak et al. | 257/98 |
| 2007/0290322 A1 | 12/2007 | Zhao et al. | 257/690 |
| 2008/0019133 A1 | 1/2008 | Kim et al. | 362/294 |
| 2008/0023722 A1* | 1/2008 | Lee et al. | 257/99 |
| 2008/0099770 A1 | 5/2008 | Mendendorp et al. | 257/79 |
| 2008/0102631 A1 | 5/2008 | Andryushchenko et al. | 438/686 |
| 2008/0173884 A1 | 7/2008 | Chitnis et al. | 257/98 |
| 2008/0180824 A1 | 7/2008 | Endoh et al. | 359/894 |
| 2009/0243057 A1* | 10/2009 | Feng et al. | 257/670 |
| 2009/0309213 A1 | 12/2009 | Takahashi et al. | 257/707 |
| 2010/0149756 A1 | 6/2010 | Rowcliffe et al. | 361/714 |
| 2010/0291737 A1 | 11/2010 | Ikeguchi et al. | 438/108 |
| 2011/0133204 A1 | 6/2011 | Lai | 257/76 |
| 2011/0171785 A1* | 7/2011 | Lin et al. | 438/122 |
| 2012/0064672 A1* | 3/2012 | Lin et al. | 438/118 |

* cited by examiner

US 8,304,292 B1

METHOD OF MAKING A SEMICONDUCTOR CHIP ASSEMBLY WITH A CERAMIC/METAL SUBSTRATE

CROSS-REFERENCE TO RELATED APPLICATIONS

This application is a divisional of U.S. application Ser. No. 12/848,176 filed Aug. 1, 2010, which claims the benefit of U.S. Provisional Application Ser. No. 61/231,686 filed Aug. 6, 2009.

BACKGROUND OF THE INVENTION

1. Field of the Invention

The present invention relates to semiconductor chip assembly, and more particularly to a semiconductor chip assembly with a semiconductor device and a ceramic/metal substrate and its method of manufacture.

2. Description of the Related Art

Semiconductor devices such as packaged and unpackaged semiconductor chips have high voltage, high frequency and high performance applications that require substantial power to perform the specified functions. As the power increases, the semiconductor device generates more heat. Furthermore, the heat build-up is aggravated by higher packing density and smaller profile sizes which reduce the surface area to dissipate the heat.

Semiconductor devices are susceptible to performance degradation as well as short life span and immediate failure at high operating temperatures. The heat not only degrades the chip, but also imposes thermal stress on the chip and surrounding elements due to thermal expansion mismatch. As a result, the heat must be dissipated rapidly and efficiently from the chip to ensure effective and reliable operation. A high thermal conductivity path typically requires heat conduction and heat spreading to a much larger surface area than the chip or a die pad it is mounted on.

Light emitting diodes (LEDs) have recently become popular alternatives to incandescent, fluorescent and halogen light sources. LEDs provide energy efficient, cost effective, long term lighting for medical, military, signage, signal, aircraft, maritime, automotive, portable, commercial and residential applications. For instance, LEDs provide light sources for lamps, flashlights, headlights, flood lights, traffic lights and displays.

LEDs include high power chips that generate high light output and considerable heat. Unfortunately, LEDs exhibit color shifts and low light output as well as short lifetimes and immediate failure at high operating temperatures. Furthermore, LED light output and reliability are constrained by heat dissipation limits. LEDs underscore the critical need for providing high power chips with adequate heat dissipation.

LED packages usually include an LED chip, a submount, electrical contacts and a thermal contact. The submount is thermally connected to and mechanically supports the LED chip. The electrical contacts are electrically connected to the anode and cathode of the LED chip. The thermal contact is thermally connected to the LED chip by the submount but requires adequate heat dissipation by the underlying carrier to prevent the LED chip from overheating.

Packages and thermal boards for high power chips have been developed extensively in the industry with a wide variety of designs and manufacturing techniques in attempts to meet performance demands in an extremely cost-competitive environment.

Plastic ball grid array (PBGA) packages have a chip and a laminated substrate enclosed in a plastic housing and are attached to a printed circuit board (PCB) by solder balls. The laminated substrate includes a dielectric layer that often includes fiberglass. The heat from the chip flows through the plastic and the dielectric layer to the solder balls and then the PCB. However, since the plastic and the dielectric layer typically have low thermal conductivity, the PBGA provides poor heat dissipation.

Quad-Flat-No Lead (QFN) packages have the chip mounted on a copper die pad which is soldered to the PCB. The heat from the chip flows through the die pad to the PCB. However, since the lead frame type interposer has limited routing capability, the QFN package cannot accommodate high input/output (I/O) chips or passive elements.

Thermal boards provide electrical routing, thermal management and mechanical support for semiconductor devices. Thermal boards usually include a substrate for signal routing, a heat spreader or heat sink for heat removal, pads for electrical connection to the semiconductor device and terminals for electrical connection to the next level assembly. The substrate can be a laminated structure with single layer or multi-layer routing circuitry and one or more dielectric layers. The heat spreader can be a metal base, a metal slug or an embedded metal layer.

Thermal boards interface with the next level assembly. For instance, the next level assembly can be a light fixture with a printed circuit board and a heat sink. In this instance, an LED package is mounted on the thermal board, the thermal board is mounted on the heat sink, the thermal board/heat sink subassembly and the printed circuit board are mounted in the light fixture and the thermal board is electrically connected to the printed circuit board by wires. The substrate routes electrical signals to the LED package from the printed circuit board and the heat spreader spreads and transfers heat from the LED package to the heat sink. The thermal board thus provides a critical thermal path for the LED chip.

Conventional packages and thermal boards have major deficiencies. For instance, dielectrics with low thermal conductivity such as epoxy limit heat dissipation, whereas dielectrics with higher thermal conductivity such as epoxy filled with ceramic or silicon carbide have low adhesion and are prohibitively expensive for high volume manufacture. The dielectric may delaminate during manufacture or prematurely during operation due to the heat. The substrate may have single layer circuitry with limited routing capability or multi-layer circuitry with thick dielectric layers which reduce heat dissipation. The heat spreader may be inefficient, cumbersome or difficult to thermally connect to the next level assembly. The manufacturing process may be unsuitable for low cost, high volume manufacture.

In view of the various development stages and limitations in currently available packages and thermal boards for high power semiconductor devices, there is a need for a semiconductor chip assembly that is cost effective, reliable, manufacturable, versatile, provides flexible signal routing and has excellent heat spreading and dissipation.

SUMMARY OF THE INVENTION

The present invention provides a semiconductor chip assembly that includes a semiconductor device, a heat spreader, a conductive trace and an insulative material. The heat spreader includes a base and a ceramic block. The conductive trace provides signal routing between a pad and a terminal. The insulative material extends between the base and the terminal. The ceramic block is embedded in the base.

The semiconductor device overlaps the ceramic block, is electrically connected to the conductive trace and is thermally connected to the heat spreader.

In accordance with an aspect of the present invention, a semiconductor chip assembly includes a semiconductor device, a heat spreader, a conductive trace and an insulative material. The heat spreader includes a base and a ceramic block. The conductive trace includes a pad and a terminal. The base is metal and the ceramic block contacts and is embedded in the base in a cavity that extends into the base and faces in an upward direction. The semiconductor device overlaps the ceramic block, is electrically connected to the pad and thereby electrically connected to the terminal, and is thermally connected to the ceramic block and thereby thermally connected to the base. The insulative material is sandwiched between the base and the terminal. The conductive trace is located outside the cavity. The base and the terminal have the same thickness and are coplanar with one another.

The semiconductor device can be a packaged or unpackaged semiconductor chip. For instance, the semiconductor device can be an LED package that includes an LED chip. Alternatively, the semiconductor device can be a semiconductor chip such as an LED chip.

The semiconductor device can be located within a periphery of the ceramic block, electrically connected to the pad using a wire bond, electrically isolated from the base by the ceramic block and thermally connected to the ceramic block using a die attach.

The heat spreader can include a cap that contacts and overlaps the ceramic block, is coplanar with the pad and is sandwiched between and thermally connects the semiconductor device and the ceramic block. The base can be copper or aluminum. The ceramic block can be located within and fill the cavity and be coplanar with the base and the terminal at a lateral surface that faces in the upward direction. The ceramic block can also be embedded in the base alone and spaced from the conductive trace and the insulative material, or alternatively, embedded in the base and the terminal and contact the base, the terminal and the insulative material. Furthermore, the ceramic block can be alumina, silicon carbide or aluminum nitride.

The conductive trace can include the pad, the terminal and a routing line and an electrically conductive path between the pad and the terminal can include the routing line. The pad can be an electrical contact for the semiconductor device, the terminal can be an electrical contact for the next level assembly, and the pad and the terminal can provide signal routing between the semiconductor device and the next level assembly.

The insulative material can be an organic or inorganic electrical insulator such as epoxy or ceramic.

The assembly can have peripheral edges that include the base, the terminal and the insulative material and exclude the ceramic block.

The assembly can include a second ceramic block that contacts and is embedded in the base and the terminal in a second cavity that extends into the base and the terminal and faces in the upward direction, the conductive trace can contact and overlap the second ceramic block over the base, the terminal and the insulative material and the ceramic blocks can have the same thickness and be coplanar with one another and with the base and the terminal at a lateral surface that faces in the upward direction.

The assembly can be a first-level or second-level single-chip or multi-chip device. For instance, the assembly can be a first-level package that contains a single chip or multiple chips. Alternatively, the assembly can be a second-level module that contains a single LED package or multiple LED packages, and each LED package can contain a single LED chip or multiple LED chips.

The present invention provides a method of making a semiconductor chip assembly that includes providing a metal plate, providing a ceramic block in the metal plate, providing an insulative material in the metal plate, wherein the metal plate includes a base and a terminal, then providing a conductive layer on the base and the ceramic block, providing a conductive trace that includes a pad, the terminal and a selected portion of the conductive layer, then mounting a semiconductor device on the ceramic block, wherein a heat spreader includes the base and the ceramic block, electrically connecting the semiconductor device to the conductive trace and thermally connecting the semiconductor device to the heat spreader.

In accordance with an aspect of the present invention, a method of making a semiconductor chip assembly includes (1) providing a metal plate, wherein the metal plate includes a top surface that faces in an upward direction and a bottom surface that faces in a downward direction opposite the upward direction, (2) forming a cavity in the metal plate, wherein the cavity extends to the top surface of the metal plate, is spaced from the bottom surface of the metal plate and faces in the upward direction, (3) providing a ceramic block in the cavity, (4) forming a slot in the metal plate, wherein the slot extends to the bottom surface of the metal plate, (5) providing an insulative material in the slot, wherein (a) the metal plate includes a base and a terminal, (b) the slot provides edges of the base and the terminal that face towards one another, (c) the cavity extends into the base, (d) the ceramic block contacts and is embedded in the base in the cavity and (e) the insulative material contacts and is sandwiched between the base and the terminal in the slot, then (6) depositing a conductive layer on the base, the terminal and the ceramic block, then (7) providing a conductive trace that includes a pad and the terminal, wherein the conductive trace includes a selected portion of the conductive layer, (8) removing selected portions of the metal plate, thereby providing additional edges of the base and the terminal, then (9) mounting a semiconductor device on the ceramic block, wherein a heat spreader includes the base and the ceramic block and the semiconductor device overlaps the ceramic block, (10) electrically connecting the semiconductor device to the pad, thereby electrically connecting the semiconductor device to the terminal, and (11) thermally connecting the semiconductor device to the ceramic block, thereby thermally connecting the semiconductor device to the base.

Providing the ceramic block can include forming an etch mask on the metal plate that selectively exposes the metal plate and defines the cavity, etching the metal plate in a pattern defined by the etch mask, thereby forming the cavity in the metal plate, then removing the etch mask and then providing the ceramic block in the cavity by depositing a slurry into the cavity and then sintering the slurry.

Providing the insulative material can include depositing an epoxy paste into the slot and then curing the epoxy paste. Alternatively, providing the insulative material can include depositing a slurry into the cavity and then sintering the slurry.

Providing the ceramic block and the insulative material can be done simultaneously or in sequence. For instance, the cavity can be formed in the metal plate, then the ceramic block can be formed in the cavity by depositing and sintering slurry, then the slot can be formed in the metal plate and then the insulative material can be formed in the slot by depositing and curing epoxy paste. Alternatively, the slot can be formed in the metal plate, then the insulative material can be formed in the slot by depositing and sintering slurry, then the cavity can be formed in the metal plate and then the ceramic block can be formed in the cavity by depositing and sintering slurry. Alternatively, the cavity and the slot can be formed in the metal plate (simultaneously or in sequence) and then the ceramic block and the insulative material can be formed simultaneously by depositing slurry into the cavity and the slot (simultaneously or in sequence) and then simultaneously sintering the slurry in the cavity and the slot.

Providing the conductive layer can include sputtering an adhesion layer such as titanium or chromium on the base, the terminal and the ceramic block, then sputtering a seed layer such as copper on the adhesion layer and then electroplating a build-up layer such as copper on the seed layer. Alternatively, providing the conductive layer can include electrolessly plating a first plated layer such as copper on the base, the terminal and the ceramic block and then electroplating a second plated layer such as copper on the first plated layer.

Providing the conductive trace can include grinding the metal plate and the ceramic block such that the metal plate and the ceramic block are laterally aligned with one another at a top lateral surface that faces in the upward direction, then depositing the conductive layer on the top lateral surface and then removing selected portions of the conductive layer.

The removing can include applying a wet chemical etch using an etch mask that defines the pad. For instance, a semi-additive process can include selectively electroplating the build-up layer (or second plated layer) using a plating mask, then removing the plating mask and then applying the wet chemical etch to the adhesive and seed layers (or first plated layer) using the build-up layer (or second plated layer) as the etch mask. Alternatively, a subtractive process can include forming the etch mask on the build-up layer (or second plated layer), then applying the wet chemical etch to the adhesive, seed and build-up layers (or first and second plated layers) and then removing the etch mask.

Mounting the semiconductor device can include providing a die attach between the semiconductor device and the ceramic block, electrically connecting the semiconductor device can include providing a wire bond between the semiconductor device and the pad, and thermally connecting the semiconductor device can include providing the die attach between the semiconductor device and the ceramic block.

The method can include providing a cap that contacts and overlaps the ceramic block and includes a selected portion of the conductive layer. Providing the cap can include the grinding, depositing the conductive layer and then removing selected portions of the conductive layer using the etch mask to define the pad and the cap. Thus, the pad and the cap can be formed simultaneously using the same grinding, deposition and removal steps. Thereafter, the semiconductor device can be mounted on and thermally connected to the cap.

The method can include forming first and second cavities in the metal plate and providing first and second ceramic blocks in the first and second cavities. The first cavity extends into the base alone and is spaced from the slot, the second cavity extends into the base and the terminal and is adjacent to and overlaps the slot, the first ceramic block contacts and is embedded in the base alone in the first cavity, the second ceramic block contacts and is embedded in the base and the terminal in the second cavity and contacts the insulative material, and the insulative material contacts and is sandwiched between the base and the terminal in the slot. The method can then include depositing the conductive layer on the base, the terminal and the ceramic blocks, providing the conductive trace on the second ceramic block over the base, the terminal and the insulative material, providing the cap on the first ceramic block and mounting the semiconductor device on the cap.

The present invention has numerous advantages. The base can provide excellent heat spreading and heat dissipation without heat flow through the insulative material. As a result, the insulative material can be a low cost dielectric with low thermal conductivity and not prone to delamination. The ceramic block can provide thermal expansion matching with a semiconductor device mounted thereon, thereby increasing reliability. The ceramic block can also electrically isolate the semiconductor device from the base, thereby providing electrostatic discharge (ESD) protection for the semiconductor device. The assembly can be manufactured using low temperature processes after the ceramic block is formed which reduces stress and improves reliability. The assembly can also be manufactured using well-controlled processes which can be easily implemented by circuit board, lead frame and tape manufacturers.

These and other features and advantages of the present invention will be further described and more readily apparent from a review of the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE INVENTION

Figure 1A:
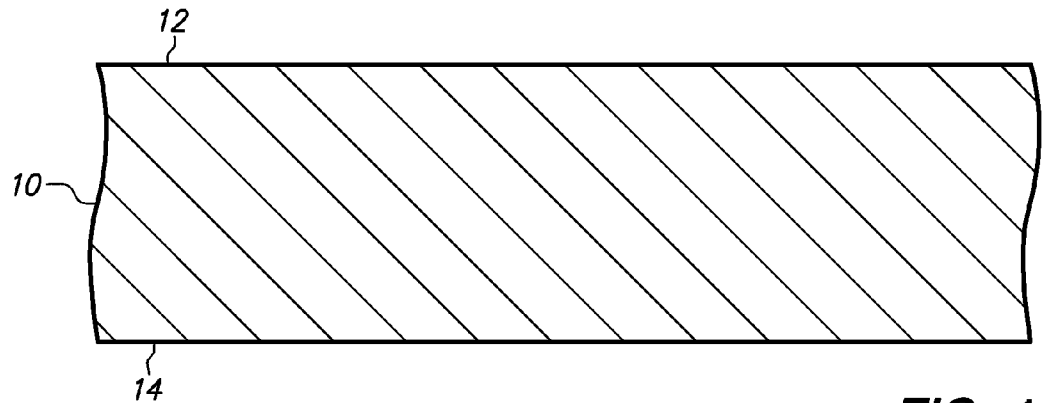
FIGS. 1A-1H are cross-sectional views showing a method of making a substrate with a ceramic block in the base and another ceramic block in the base and the terminal in accordance with an embodiment of the present invention.
Figure 1B:
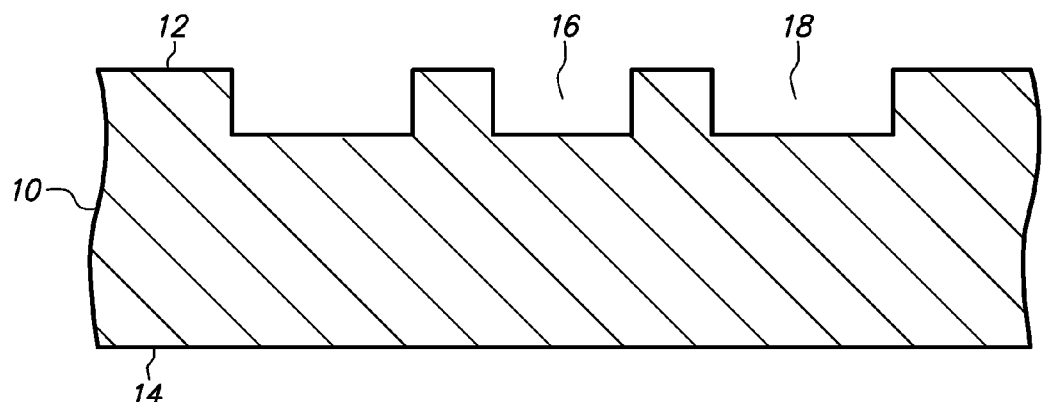
Figure 1C:
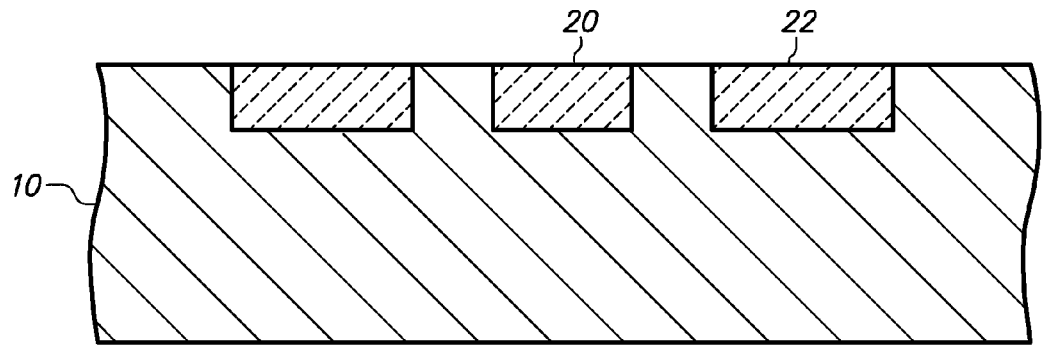
Figure 1D:
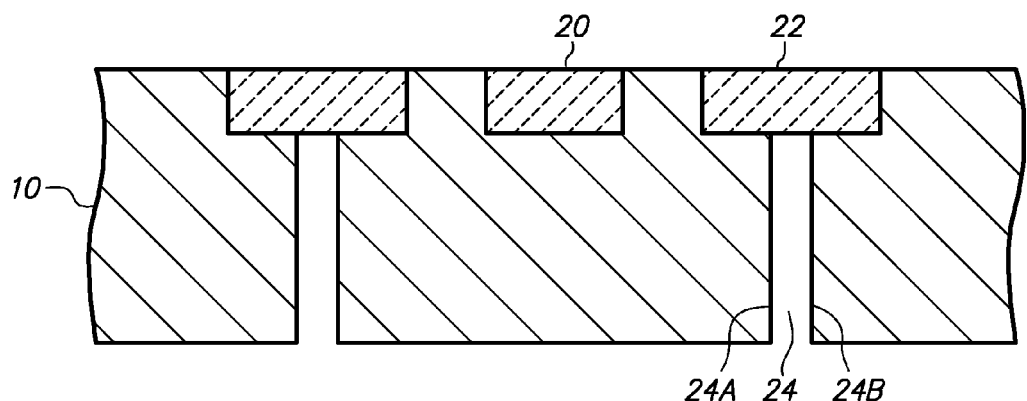
Figure 1E:
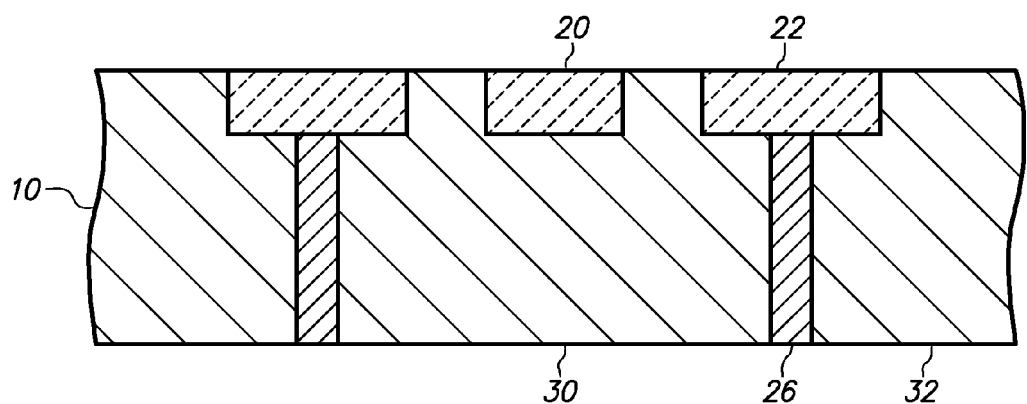
Figure 1F:
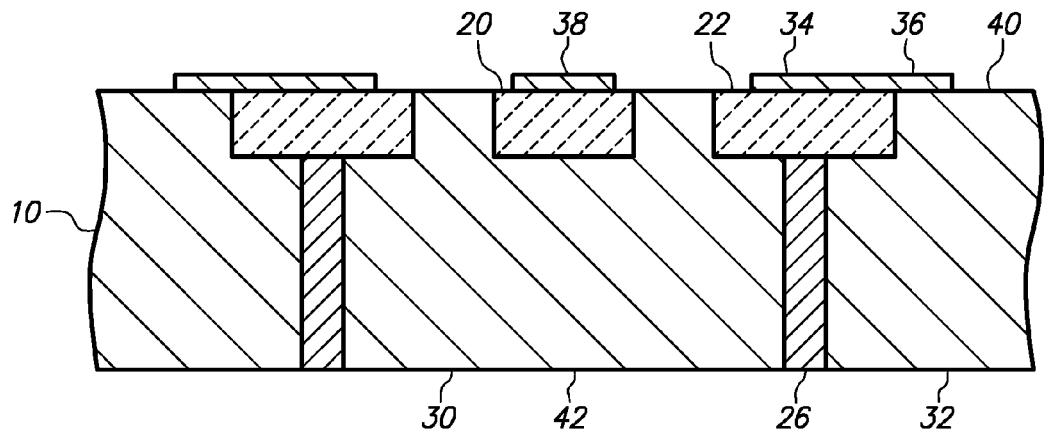
Figure 1G:
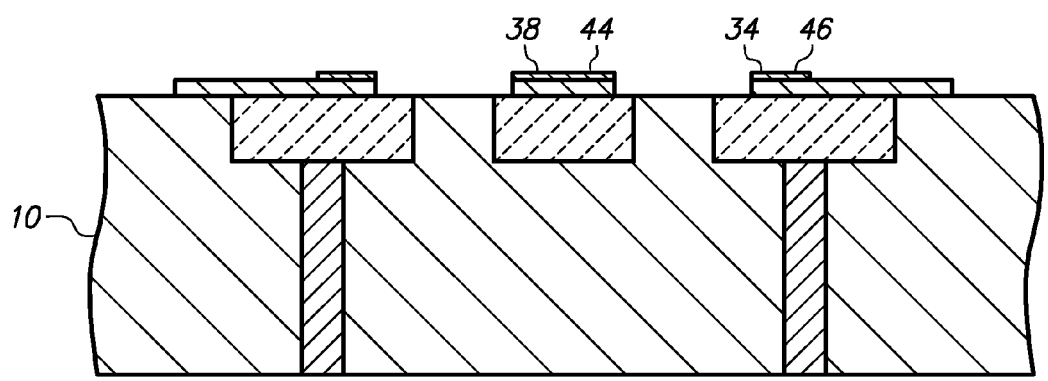
Figure 1H:
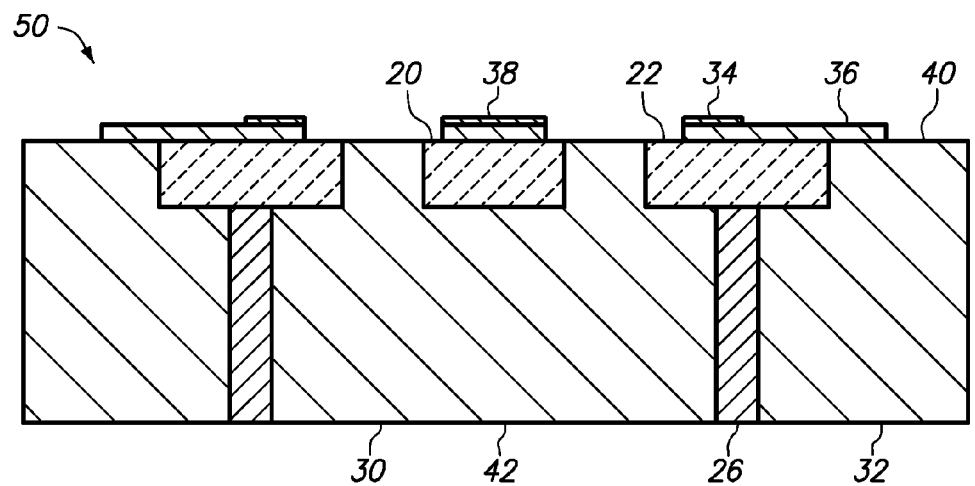
Figure 1I:
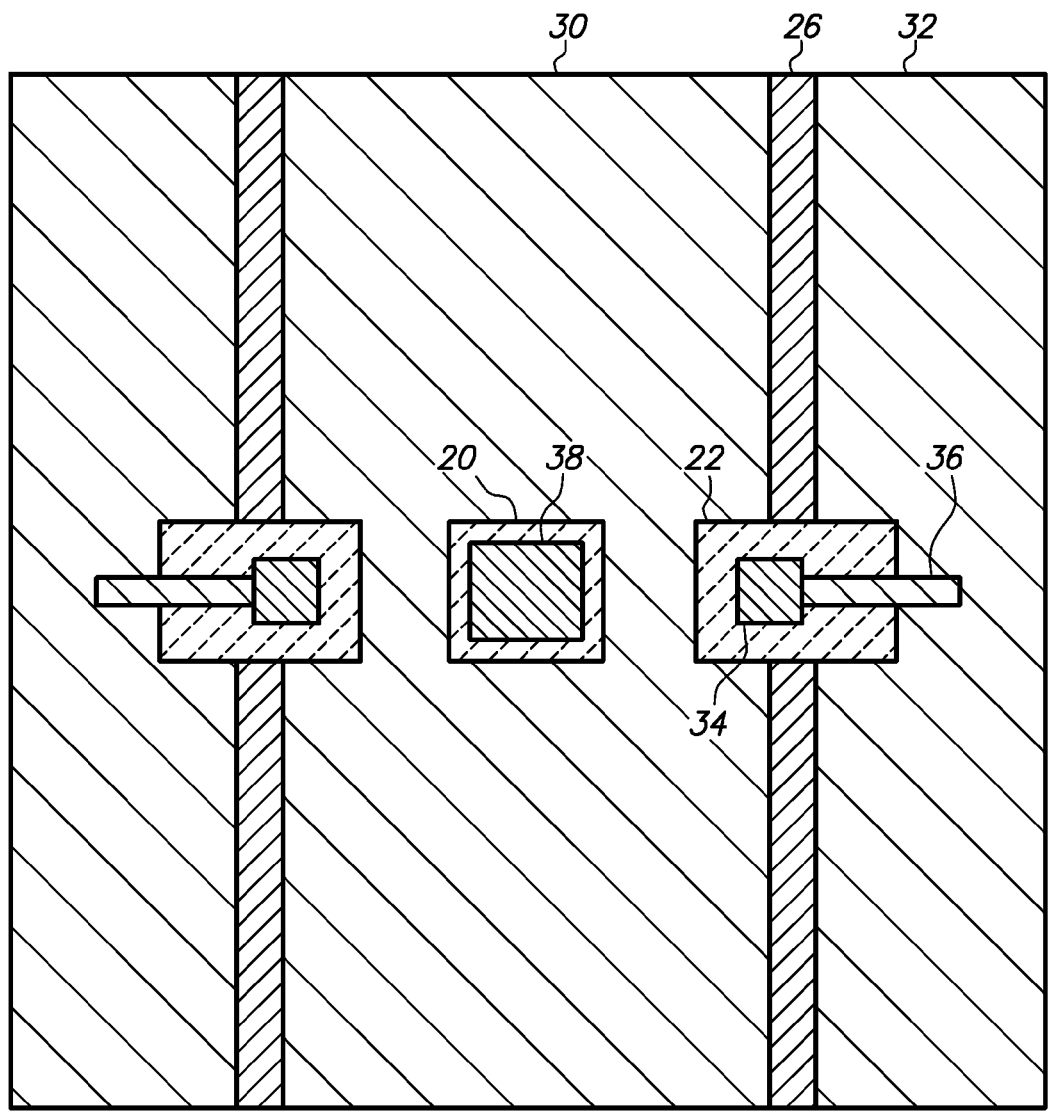
FIGS. 1I and 1J are top and bottom views, respectively, corresponding to FIG. 1H.
Figure 1J:
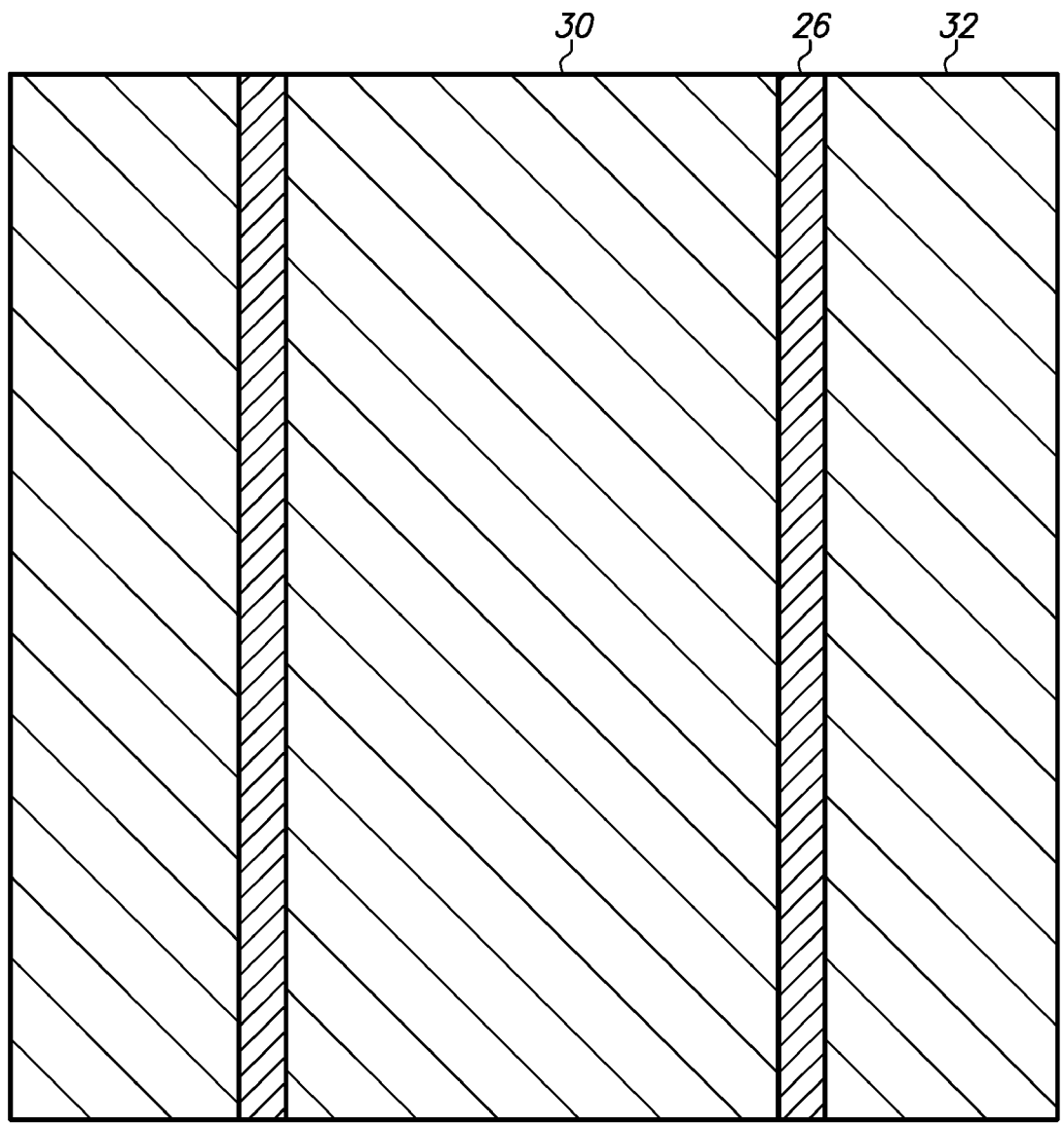

FIGS. 1A-1H are cross-sectional views showing a method of making a substrate with a ceramic block in the base and another ceramic block in the base and the terminal in accordance with an embodiment of the present invention, and FIGS. 1I and 1J are top and bottom views, respectively, corresponding to FIG. 1H.

FIG. 1A is a cross-sectional view of metal plate 10 which includes top surface 12 and bottom surface 14. Metal plate 10 is copper and has a thickness of 2000 microns.

FIG. 1B is a cross-sectional view of cavities 16 and 18 in metal plate 10. Cavities 16 and 18 extend into metal plate 10 at top surface 12, are spaced from bottom surface 14 and face in the upward direction and have a depth of 750 microns.

Cavities 16 and 18 are formed using an etch mask on top surface 12 and a cover mask on bottom surface 14. The etch mask and the cover mask are photoresist layers deposited on metal plate 10 by dry film lamination although wet spin coating and curtain coating are suitable. The etch mask is patterned by selectively applying light through a reticle, applying a developer solution and then hard baking, as is conventional. As a result, the etch mask selectively exposes top surface 12 and defines cavities 16 and 18 and the cover mask remains unpatterned and covers bottom surface 14. Metal plate 10 is then etched in the pattern defined by the etch mask using a wet chemical etch. The copper etching solution contains alkaline ammonia or a dilute mixture of nitric and hydrochloric acid. Thereafter, the etch mask and the cover mask are removed using a solvent, such as a strong alkaline solution containing potassium hydroxide with a pH of 14, that is highly selective of photoresist with respect to copper.

FIG. 1C is a cross-sectional view of ceramic blocks 20 and 22 in metal plate 10. Ceramic block 20 contacts and is embedded in metal plate 10 and is located within and fills cavity 16, and ceramic block 22 contacts and is embedded in metal plate 10 and is located within and fills cavity 18. Ceramic blocks 20 and 22 have the same thickness (750 microns) and are coplanar with one another. Furthermore, ceramic blocks 20 and 22 are alumina and have high thermal conductivity, high electrical resistance, high mechanical strength and a low coefficient of thermal expansion (CTE).

Ceramic blocks 20 and 22 are initially an alumina slurry that includes alumina particles and glass particles dispersed as finely divided powder in a thermoplastic organic binder and a solvent. The glass reduces the sintering temperature of the slurry. The alumina slurry is deposited into cavities 16 and 18 by screen printing or spraying. The alumina slurry is then fired at a relatively high temperature such as 800° C. in ambient gas for 15 minutes to remove the organic binder and the solvent, thereby converting the alumina slurry in each cavity into a sintered or hardened alumina block that is an alumina/glass composite. The glass increases the mechanical strength of the alumina block and reduces the coefficient of thermal expansion of the alumina block so that it more closely matches silicon. Thereafter, metal plate 10 and ceramic blocks 20 and 22 are grinded by a rotating diamond sand wheel and rinsed in distilled water. As a result, metal plate 10 and ceramic blocks 20 and 22 are coplanar with one another at a smoothed lapped lateral top surface that faces in the upward direction.

FIG. 1D is a cross-sectional view of slot 24 in metal plate 10. Slot 24 extends into metal plate 10 at bottom surface 14 to cavity 18, is spaced from ceramic block 20, is adjacent to ceramic block 22 and has a depth of 1250 microns. Slot 24 includes edges 24A and 24B that face towards one another. Slot 24 can be formed by wet chemical etching in the same manner as cavities 16 and 18 as well as by mechanical drilling or water jet cutting.

FIG. 1E is a cross-sectional view of insulative material 26 in metal plate 10. Insulative material 26 contacts and is embedded in metal plate 10, is located within and fills slot 24 and is an electrically insulative epoxy.

Insulative material 26 is initially an epoxy paste that is deposited into slot 24 by screen printing or dispensing by an injection nozzle. Thereafter, the epoxy paste is heated at a relatively low temperature such as 190° C., thereby converting the epoxy paste into C-stage cured epoxy.

At this stage, metal plate 10 includes base 30 and terminal 32 that have the same thickness (2000 microns), are coplanar with one another at surfaces 12 and 14, have respective edges 24A and 24B that face towards one another and are separated from one another by ceramic block 22 and insulative material 26. Cavity 16 extends into base 30 alone and is spaced from slot 24 and cavity 18 extends into base 30 and terminal 32 and is adjacent to slot 24. Ceramic block 20 contacts and is embedded in base 30 alone and is spaced from insulative material 26, ceramic block 22 contacts and is embedded in base 30 and terminal 32 and contacts insulative material 26, and insulative material 26 contacts and is sandwiched between base 30 and terminal 32.

FIG. 1F is a cross-sectional view of pad 34, routing line 36 and cap 38 on the structure. Pad 34 contacts and overlaps and is located within the periphery of ceramic block 22 and is spaced from ceramic block 20, insulative material 26, base 30 and terminal 32. Routing line 36 contacts and overlaps ceramic block 22 and terminal 32 and is spaced from ceramic block 20, insulative material 26 and base 30. Cap 38 contacts and overlaps ceramic block 20 and is spaced from ceramic block 22, insulative material 26, base 30 and terminal 32.

Pad 34, routing line 36 and cap 38 are formed semi-additively. A titanium adhesion layer is sputtered on ceramic blocks 20 and 22, base 30 and terminal 32 and then a copper seed layer is electrolessly plated on the titanium adhesion layer. Thereafter, a plating mask is formed on the copper seed layer and a cover mask is formed on bottom surface 14 in a manner similar to the previous etch mask and cover mask, and the plating mask is patterned in a manner similar to the previous etch mask. As a result, the plating mask selectively exposes the copper seed layer and the cover mask remains unpatterned and covers bottom surface 14. A copper build-up layer is then selectively electroplated on the copper seed layer in the pattern defined by the plating mask. Thereafter, the plating mask and the cover mask are removed, then the copper seed layer is selectively etched with a copper etching solution using the patterned copper build-up layer as an etch mask and then the titanium adhesion layer is selectively etched with a titanium etching solution that contains hydrofluoric acid or ammonia fluoride using the patterned copper build-up layer as an etch mask. Thus, the patterned copper build-up layer provides an etch mask that defines pad 34, routing line 36 and cap 38.

The titanium adhesion layer has a thickness of 0.05 microns, the copper seed layer has a thickness of 0.05 microns, the copper build-up layer has a thickness of 15 microns. Thus, the titanium/copper conductive layer has a thickness of about 15 microns. The titanium adhesion layer, the copper seed layer and the copper build-up layer are shown as a single layer for convenience of illustration.

Conductive trace 40 is provided by terminal 32, pad 34 and routing line 36. Terminal 32 is electrically connected to pad 34 by routing line 36. Conductive trace 40 provides horizontal (lateral) fan-out routing from pad 34 across routing line 36 to terminal 32 and vertical routing at terminal 32 from top surface 12 to bottom surface 14.

Heat spreader 42 is provided by ceramic block 20, base 30 and cap 38. Ceramic block 20 contacts and is sandwiched between base 30 and cap 38. Cap 38 is centrally located within the periphery of ceramic block 20 and is spaced from base 30. As a result, cap 38 is thermally connected to and electrically isolated from base 30 by ceramic block 20.

FIG. 1G is a cross-sectional view of the structure with plated contacts 44 and 46 formed on pad 34 and cap 38 respectively. Plated contacts 44 and 46 are thin spot plated coatings that contact pad 34 and cap 38.

Plated contacts 44 and 46 are formed additively A plating mask is formed on top surface 12 and conductive trace 40 and a cover mask is formed on bottom surface 14 in a manner similar to the previous etch mask and cover mask, and the plating mask is patterned in a manner similar to the previous etch mask. As a result, the plating mask selectively exposes pad 34 and cap 38 and the cover mask remains unpatterned and covers bottom surface 14. Thereafter, a nickel layer is selectively electroplated on the copper build-up layer and a silver layer is selectively electroplated on the nickel layer in the pattern defined by the plating mask and then the plating mask and the cover mask are removed.

The buried nickel layer has a thickness of 3 microns, the silver surface layer has a thickness of 0.5 microns, and plated contacts 44 and 46 have a thickness of 3.5 microns. The nickel and silver layers are shown as a single layer for convenience of illustration.

Pad 34 and cap 38 treated with plated contacts 44 and 46 as a surface finish have a silver surface layer that provides a wettable surface to facilitate solder reflow for a solder joint and a metallurgical surface for a wire bond.

FIGS. 1H, 1I and 1J are cross-sectional, top and bottom views, respectively, of ceramic/metal substrate 50 after it is detached at peripheral edges along cut lines from a support frame and/or adjacent substrates in a batch.

Substrate 50 includes ceramic block 22, conductive trace 40 and heat spreader 42. Conductive trace 40 includes terminal 32, pad 34 and routing line 36. Heat spreader 42 includes ceramic block 20, base 30 and cap 38.

Insulative material 26, base 30 and terminal 32 extend to straight vertical peripheral edges of substrate 50 after it is detached or singulated from a batch of identical simultaneously manufactured substrates. Furthermore, detaching substrate 50 from the batch provides two additional edges for base 30 and three additional edges for terminal 32 at the peripheral edges of substrate 50 and electrically isolates base 30 and terminal 32 from one another.

Insulative material 26 mechanically attaches base 30 to terminal 32 so that substrate 50 can stand alone without extra mechanical support. Base 30 is a thick metal carrier that provides strong rigidity support for substrate 50. Furthermore, pad 34 is customized as an electrical interface for a semiconductor device such as an LED package or an LED chip that is subsequently mounted on cap 38, terminal 32 is customized as an electrical interface for the next level assembly such as a solderable wire from a printed circuit board, cap 38 is customized as a thermal interface for the semiconductor device, and base 32 is customized as a thermal interface for the next level assembly such as a heat sink in the printed circuit board.

Heat spreader 42 provides heat spreading and heat dissipation from the semiconductor device to the next level assembly that substrate 50 is subsequently mounted on. The semiconductor device generates heat that flows into cap 38, through cap 38 into ceramic block 20 and through ceramic block 20 into base 30 where it is spread out and dissipated in the downward direction, for instance to an underlying heat sink. Furthermore, ceramic block 20 provides an embedded die paddle for the semiconductor device with a coefficient of thermal expansion (CTE) that matches silicon and a high breakdown voltage that provides critical shielding from electrostatic discharge (ESD) induced from base 30.

Substrate 50 can include registration holes (not shown) that are drilled or sliced through base 32 so that it can be positioned by inserting tooling pins through the registration holes when it is subsequently mounted on an underlying carrier. Substrate 50 can also include a top solder mask that selectively exposes pad 34 and cap 38 as well as a bottom solder mask that selectively exposes base 30 and terminal 32. Substrate 50 can also include multiple conductive traces 40 that each include a terminal 32, pad 34 and routing line 36. A single conductive trace 40 is described and labeled for convenience of illustration.

Figure 2A:
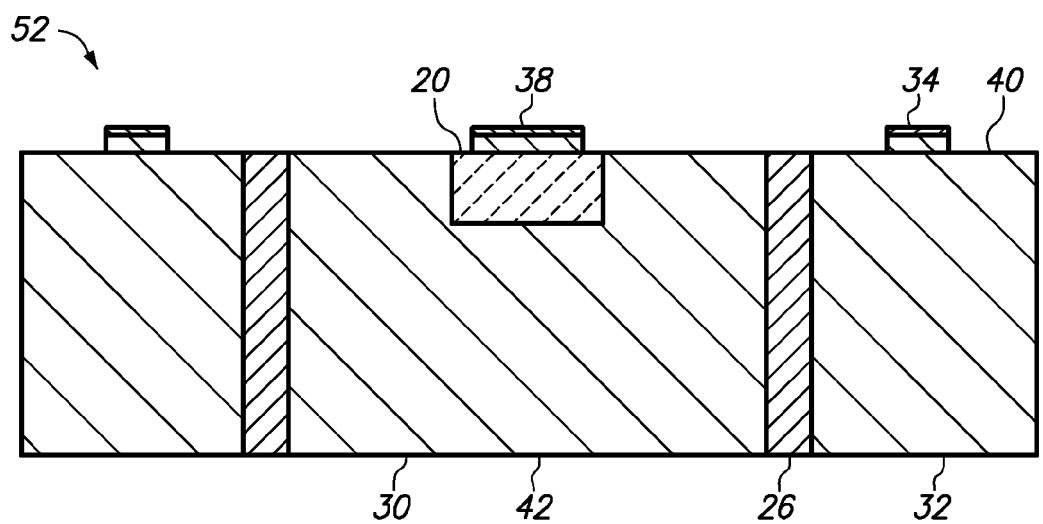
FIGS. 2A, 2B and 2C are cross-sectional, top and bottom views, respectively, of a substrate with a ceramic block in the base in accordance with an embodiment of the present invention.
Figure 2B:
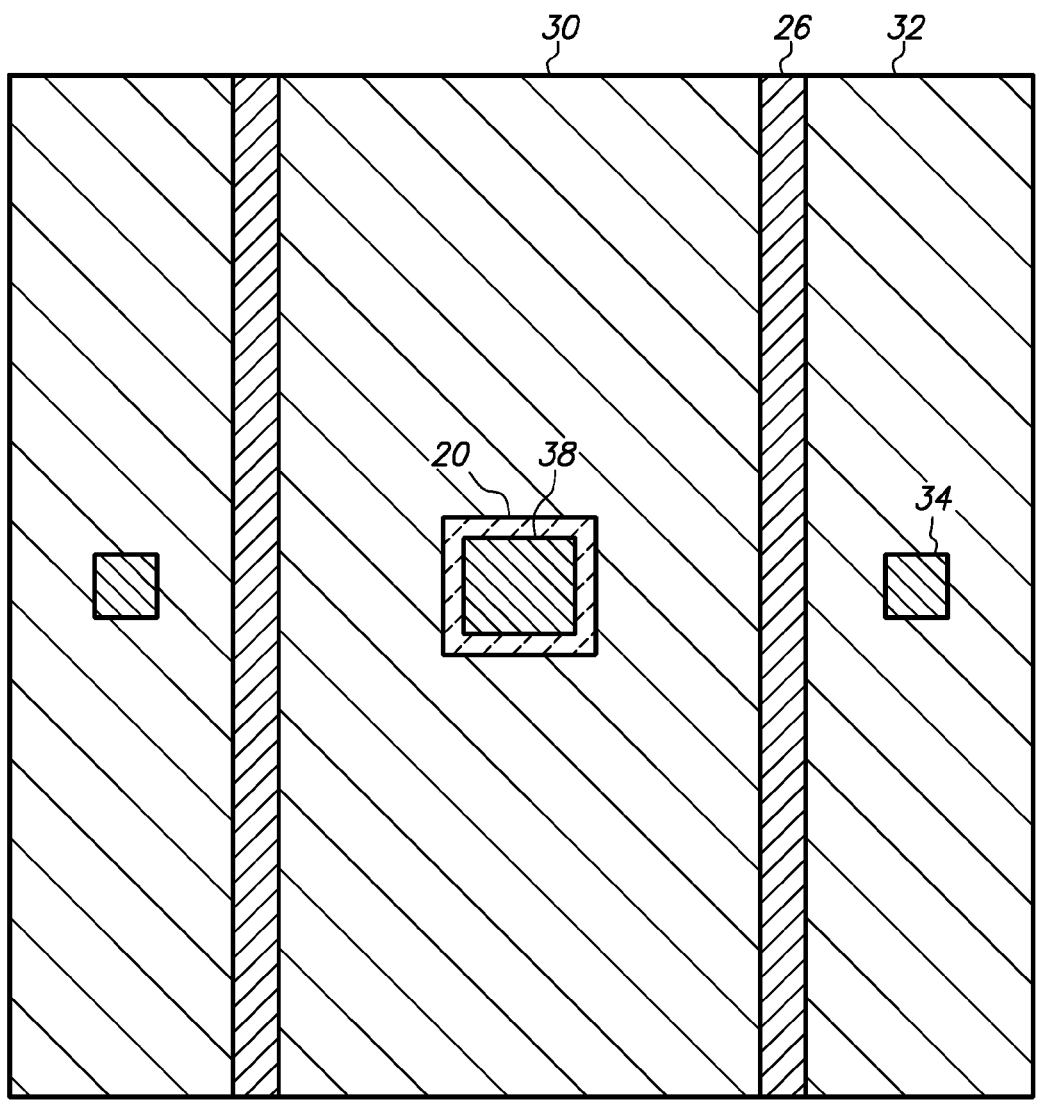
Figure 2C:
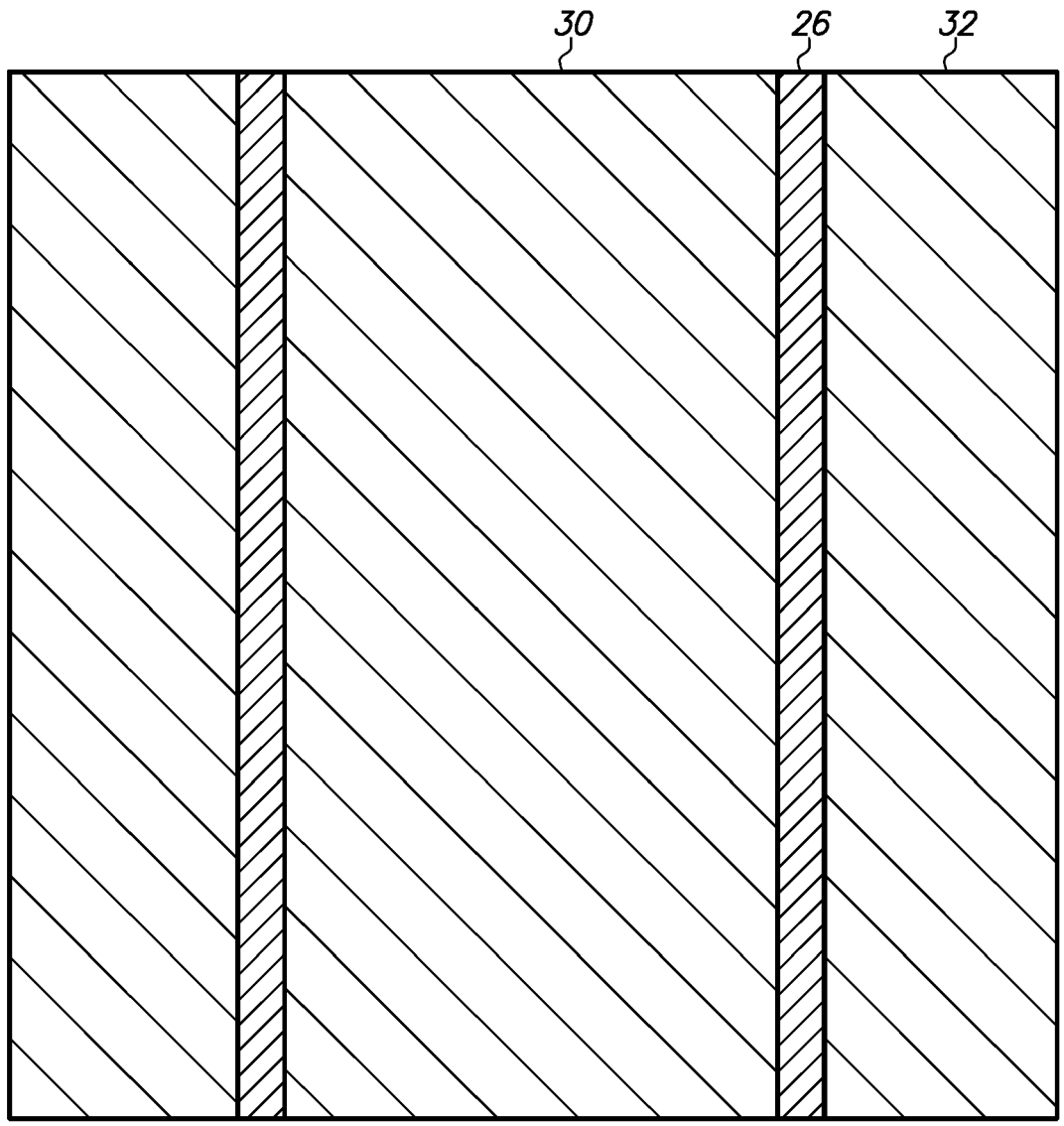

FIGS. 2A, 2B and 2C are cross-sectional, top and bottom views, respectively, of a substrate with a ceramic block in the base in accordance with an embodiment of the present invention. In substrate 52, pad 34 is mounted on terminal 32 and ceramic block 22 and routing line 36 are omitted. As a result, ceramic block 20 is the only ceramic block in the substrate, insulative material 26 extends to top surface 12 and conductive trace 40 provides only vertical routing.

Figure 3A:
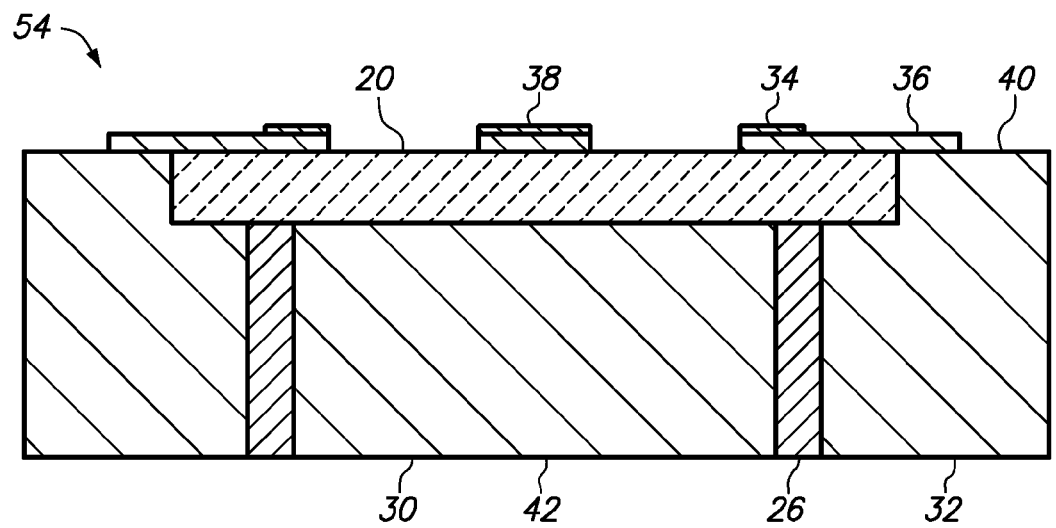
FIGS. 3A, 3B and 3C are cross-sectional, top and bottom views, respectively, of a substrate with a ceramic block in the base and the terminal in accordance with an embodiment of the present invention.
Figure 3B:
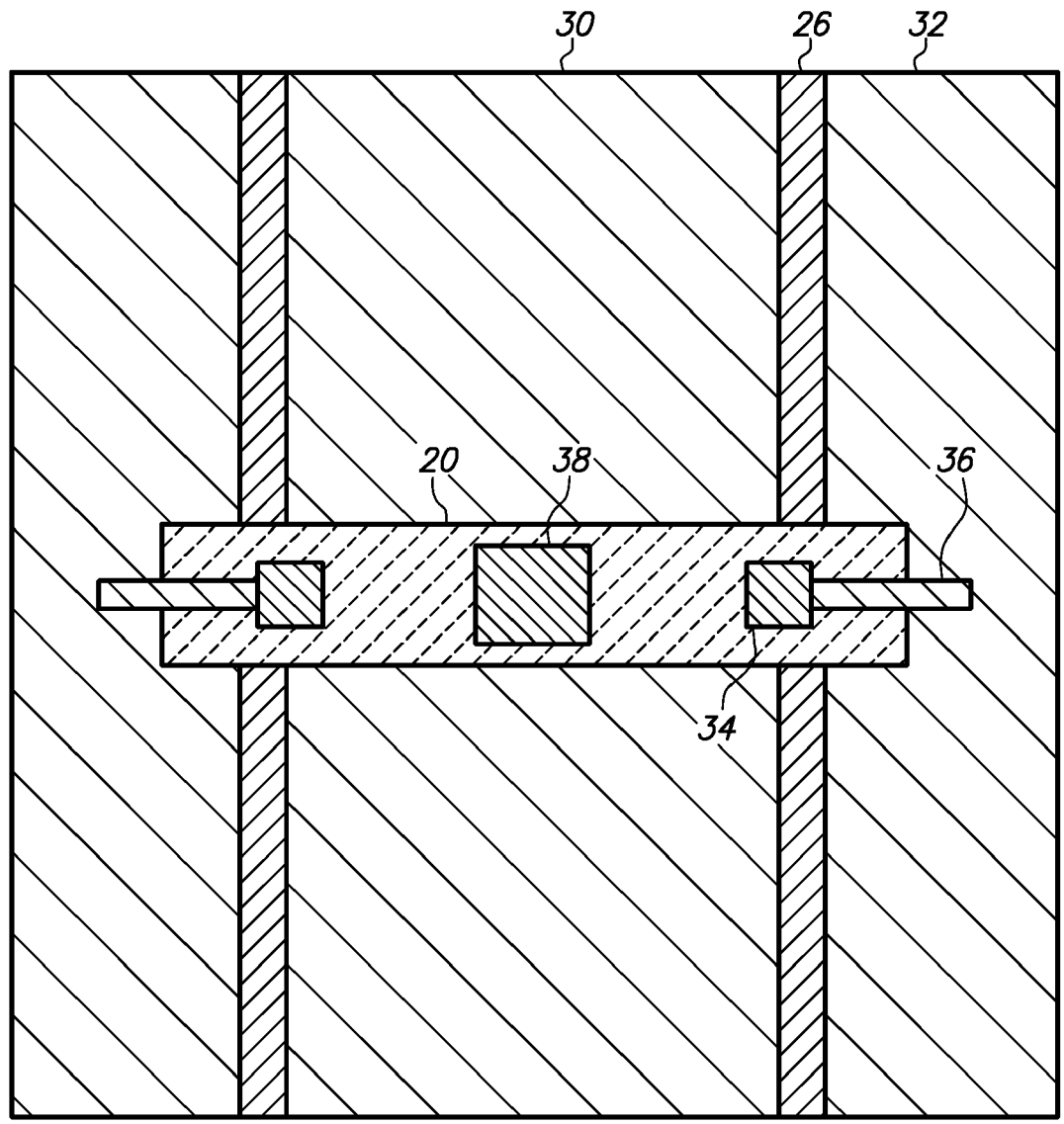
Figure 3C:
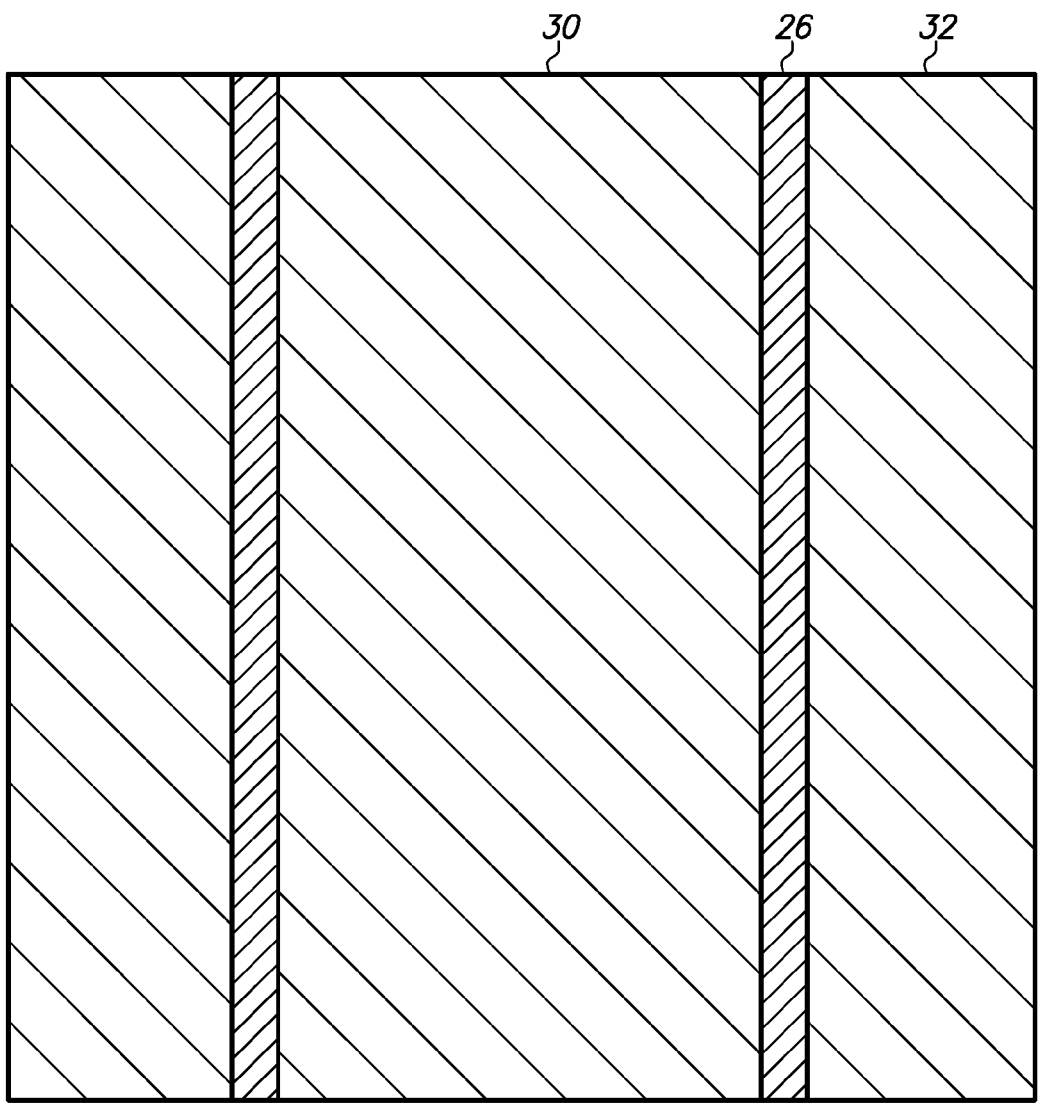

FIGS. 3A, 3B and 3C are cross-sectional, top and bottom views, respectively, of a substrate with a ceramic block in the base and the terminal in accordance with an embodiment of the present invention. In substrate 54, ceramic blocks 20 and 22 are merged into a single ceramic block 20 in a single cavity. As a result, ceramic block 20 is the only ceramic block in the substrate.

Figure 4A:
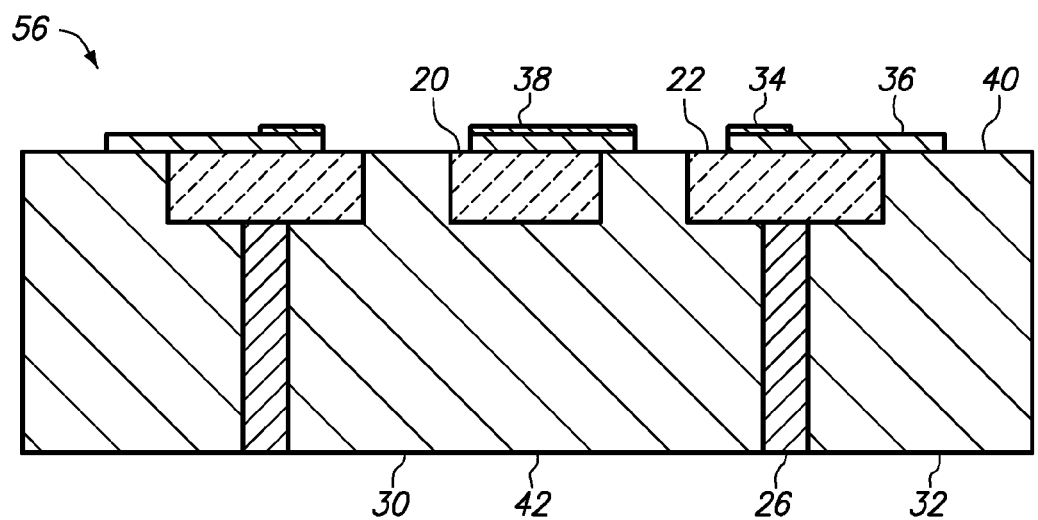
FIGS. 4A, 4B and 4C are cross-sectional, top and bottom views, respectively, of a substrate with ceramic in the slot in accordance with an embodiment of the present invention.
Figure 4B:
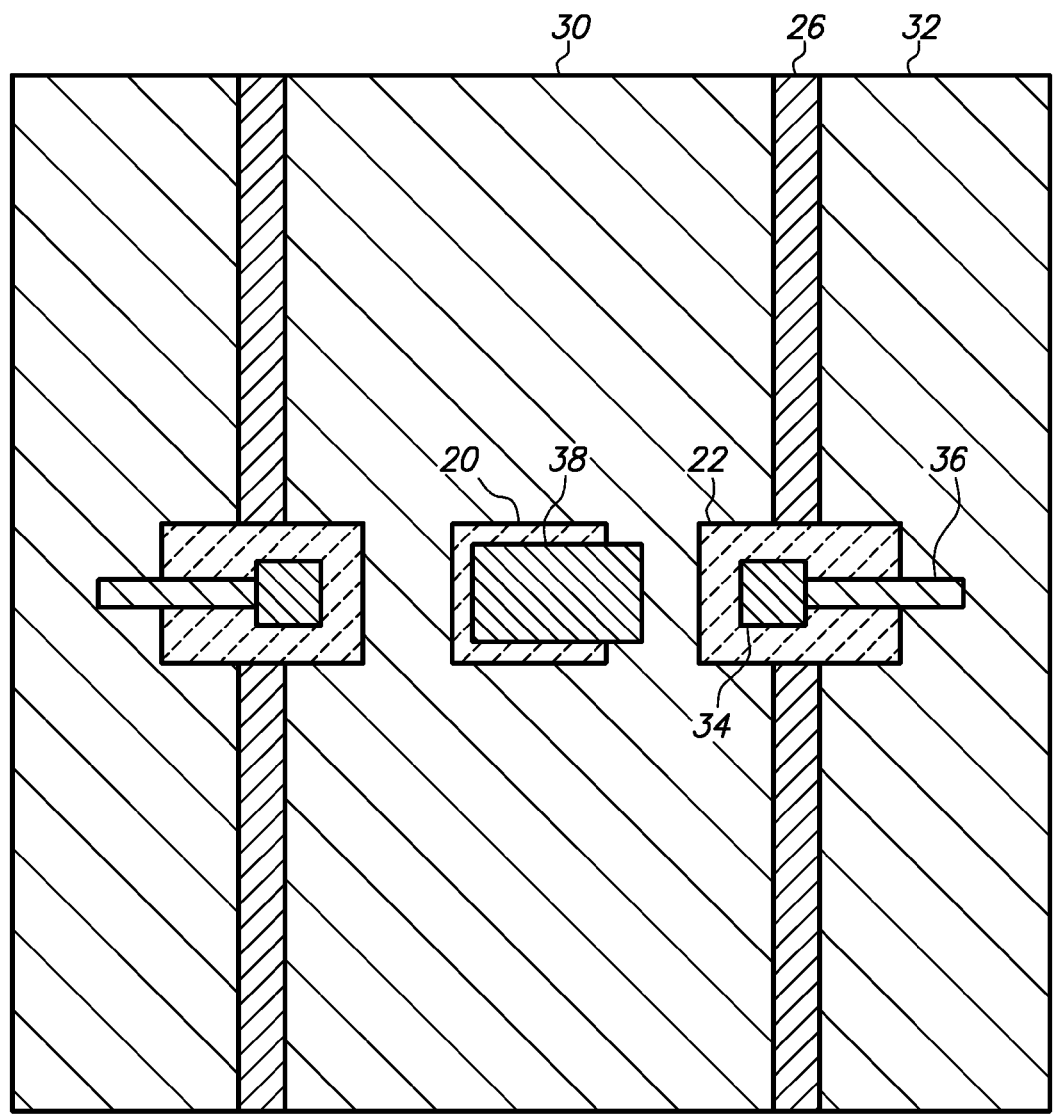
Figure 4C:
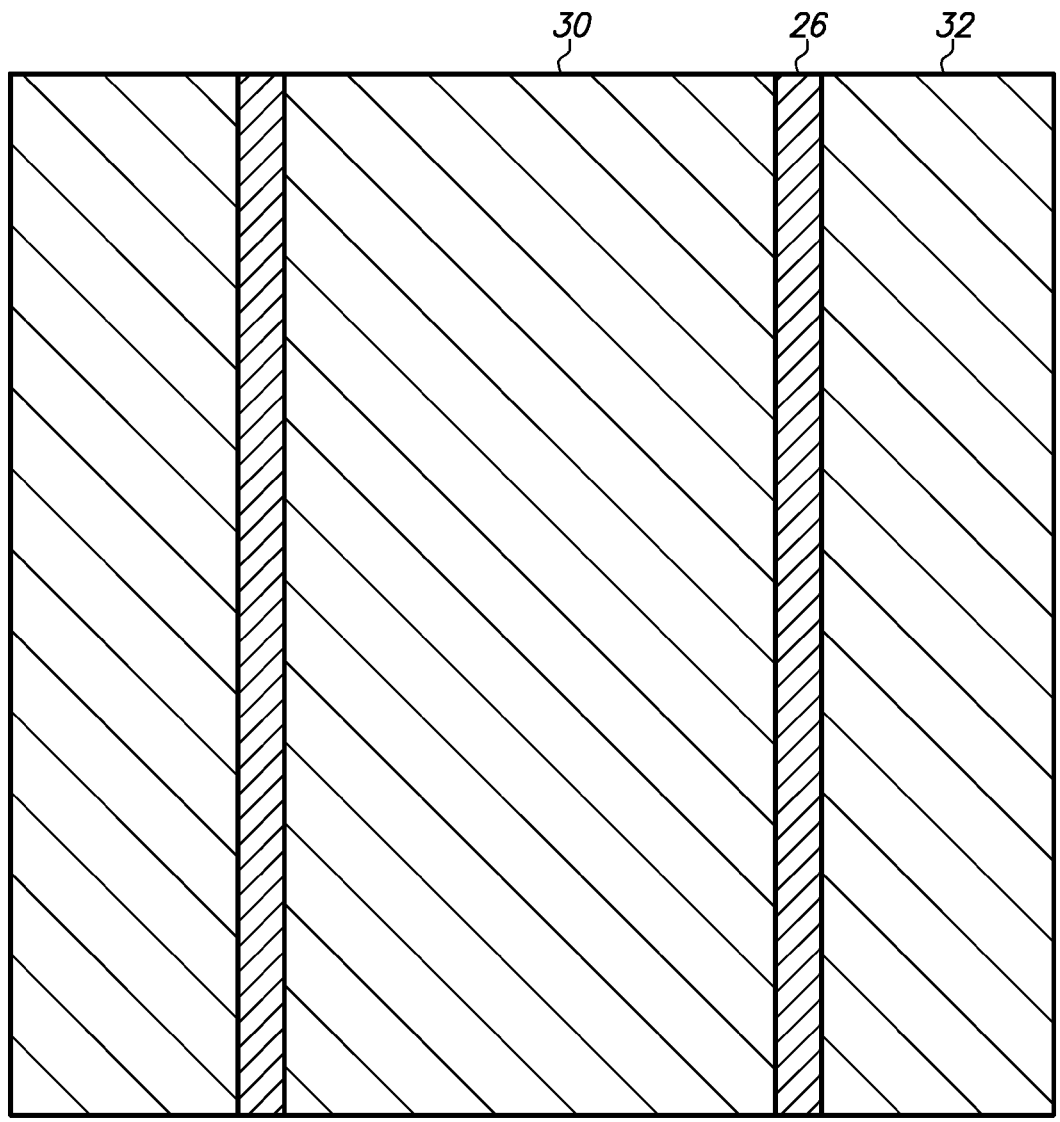

FIGS. 4A, 4B and 4C are cross-sectional, top and bottom views, respectively, of a substrate with ceramic in the slot in accordance with an embodiment of the present invention. In substrate 56, ceramic block 22 and insulative material 26 are a single-piece ceramic provided by depositing the slurry into recess 18 and slot 24 and then firing the slurry.

Figure 5A:
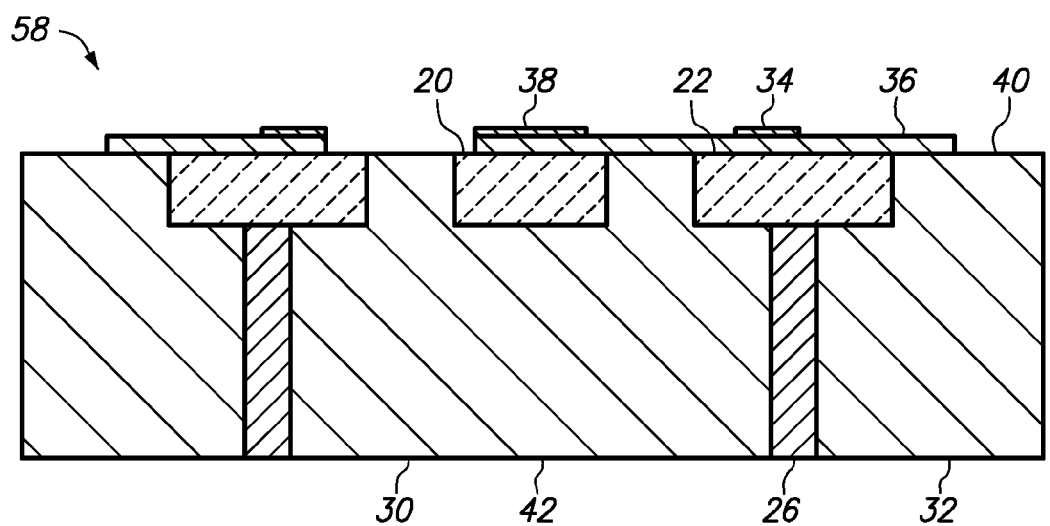
FIGS. 5A, 5B and 5C are cross-sectional, top and bottom views, respectively, of a substrate with a cap electrically connected to the base in accordance with an embodiment of the present invention.
Figure 5B:
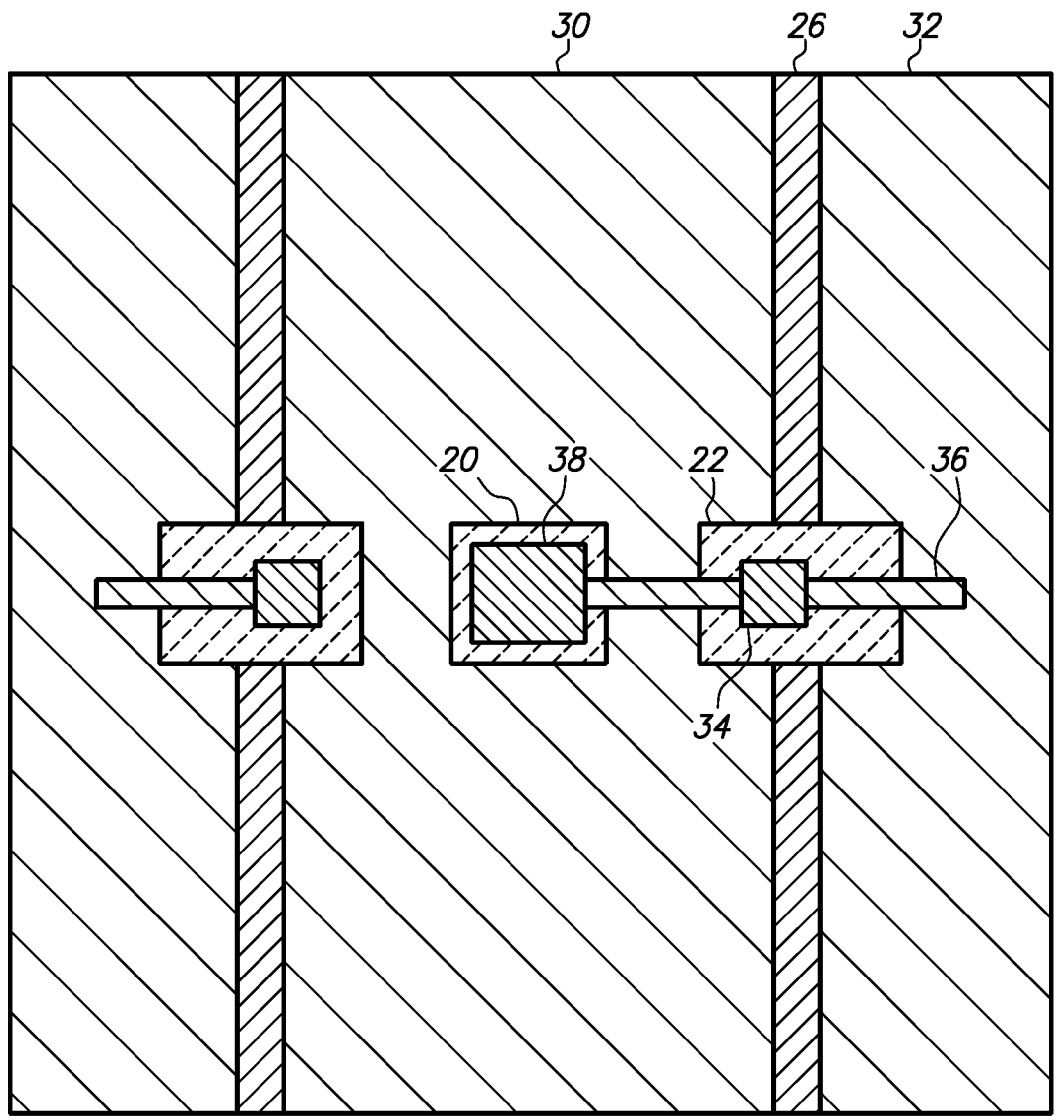
Figure 5C:
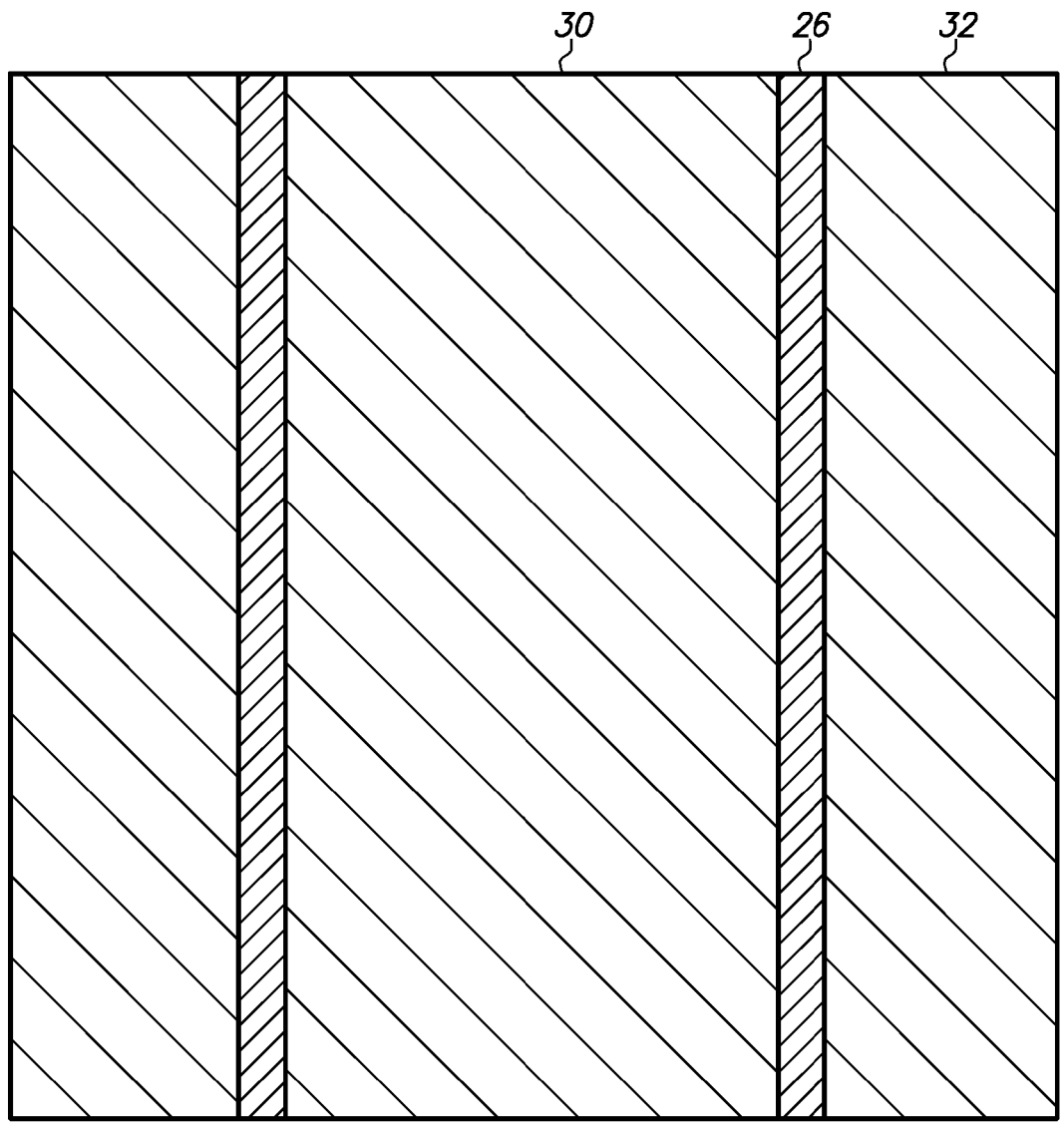

FIGS. 5A, 5B and 5C are cross-sectional, top and bottom views, respectively, of a substrate with a cap electrically connected to the base in accordance with an embodiment of the present invention. In substrate 58, cap 38 extends outside the periphery of ceramic block 20 and contacts base 30. As a result, heat spreader 42 does not provide ESD protection for the semiconductor device but can ground the semiconductor device through base 30 and cap 38.

Figure 6A:
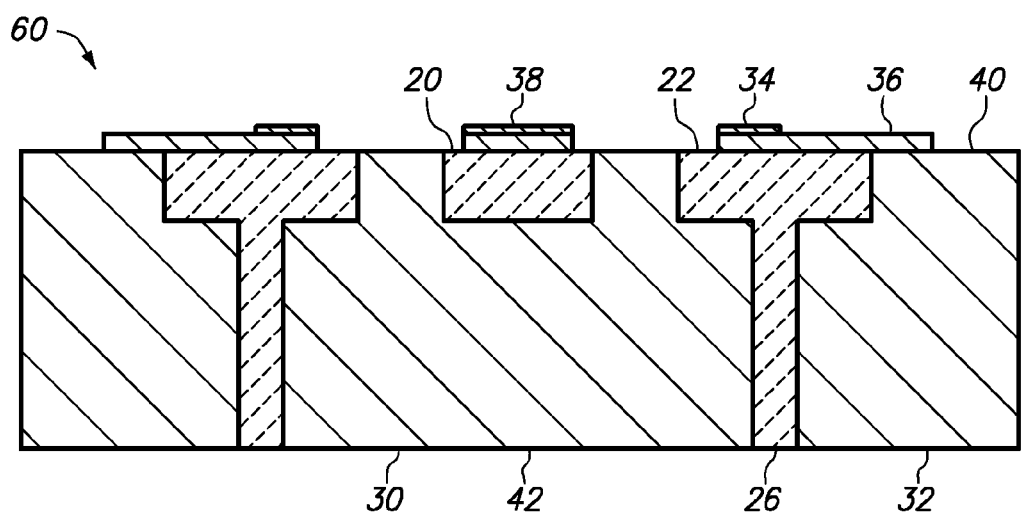
FIGS. 6A, 6B and 6C are cross-sectional, top and bottom views, respectively, of a substrate with a conductive trace electrically connected to the base in accordance with an embodiment of the present invention.
Figure 6B:
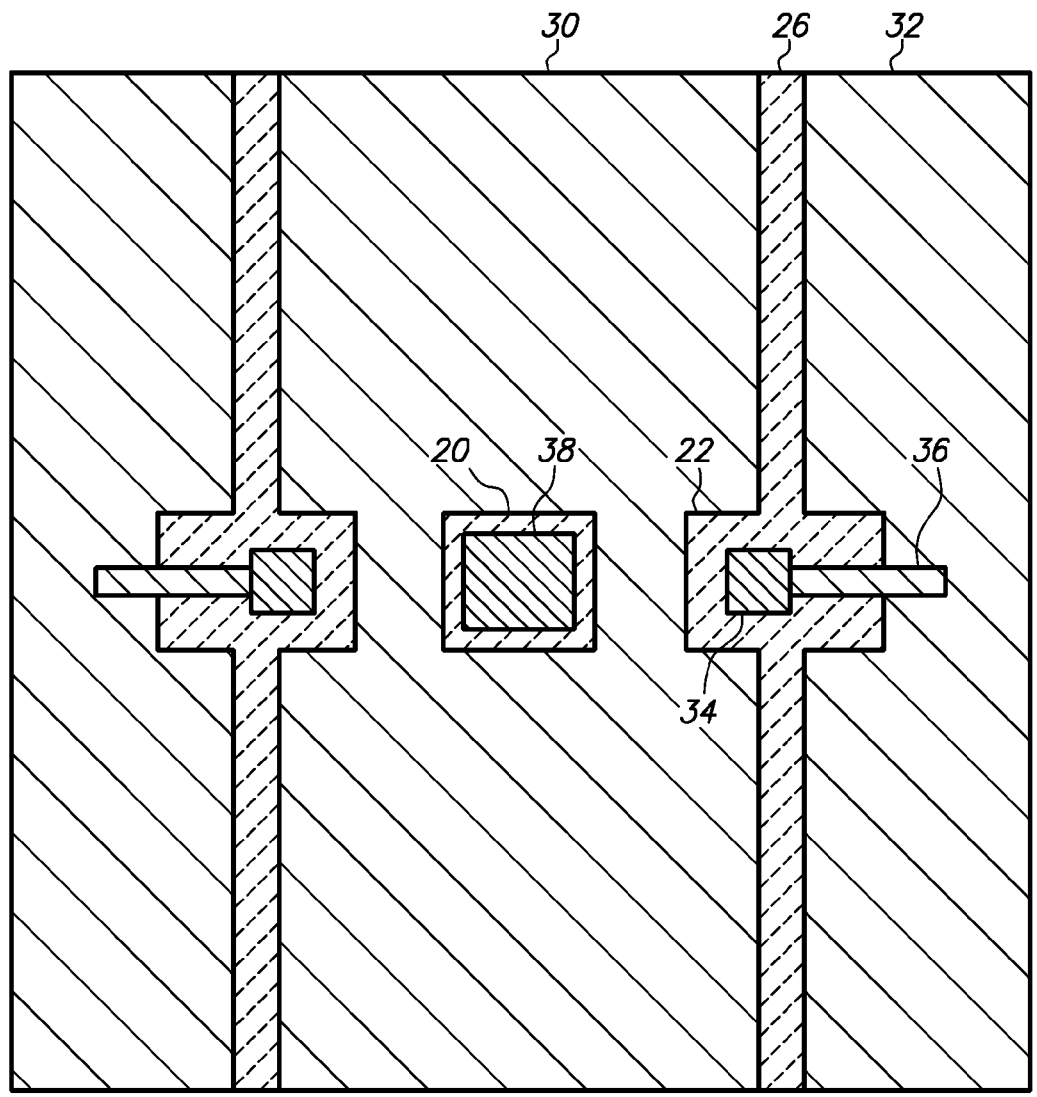
Figure 6C:
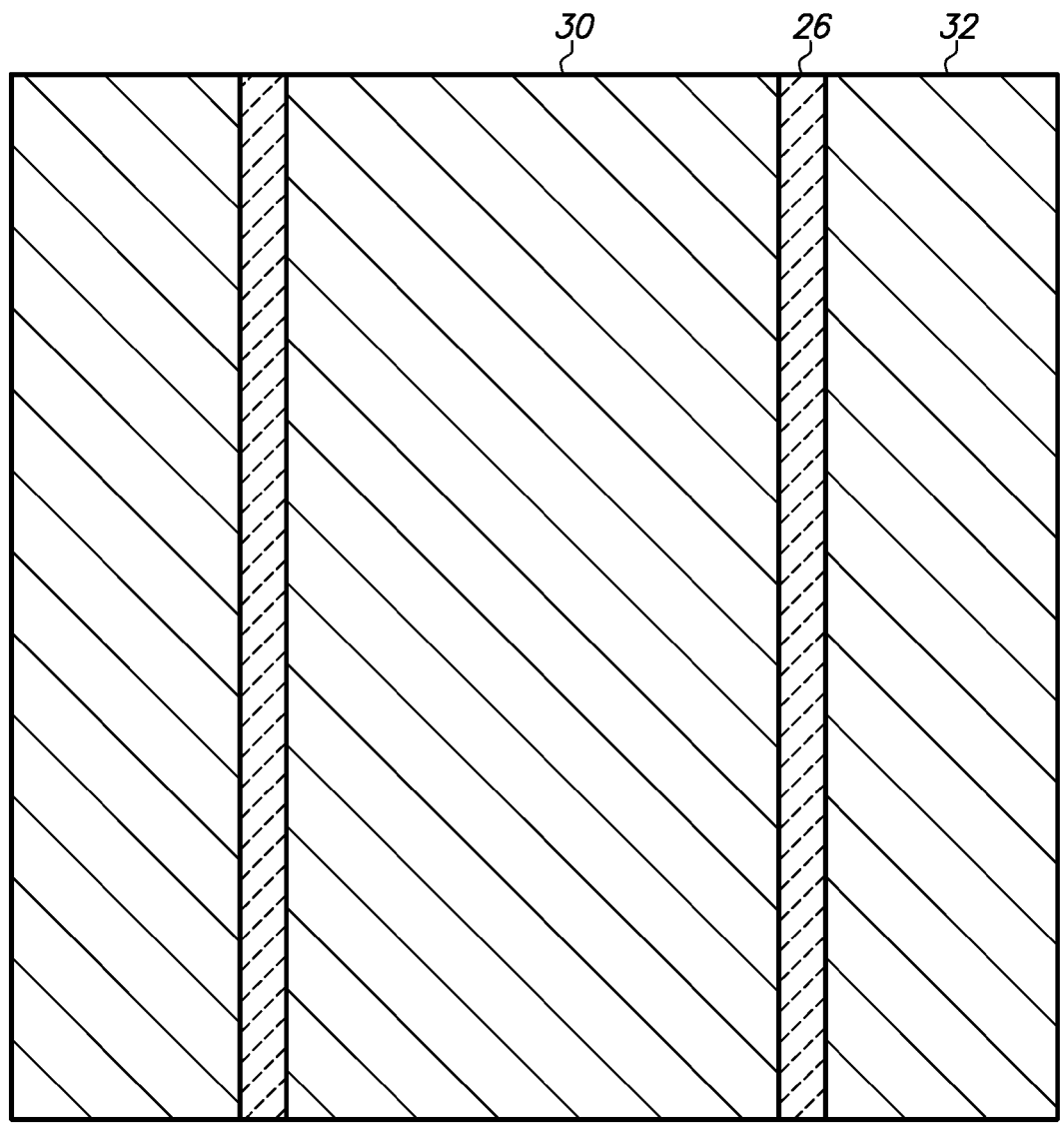

FIGS. 6A, 6B and 6C are cross-sectional, top and bottom views, respectively, of a substrate with a conductive trace electrically connected to the base in accordance with an embodiment of the present invention. In substrate 60, routing line 36 extends to cap 38. As a result, heat spreader 42 does not provide ESD protection for the semiconductor device but routing line 36 electrically connects the backside of the semiconductor device to terminal 32.

Figure 7A:
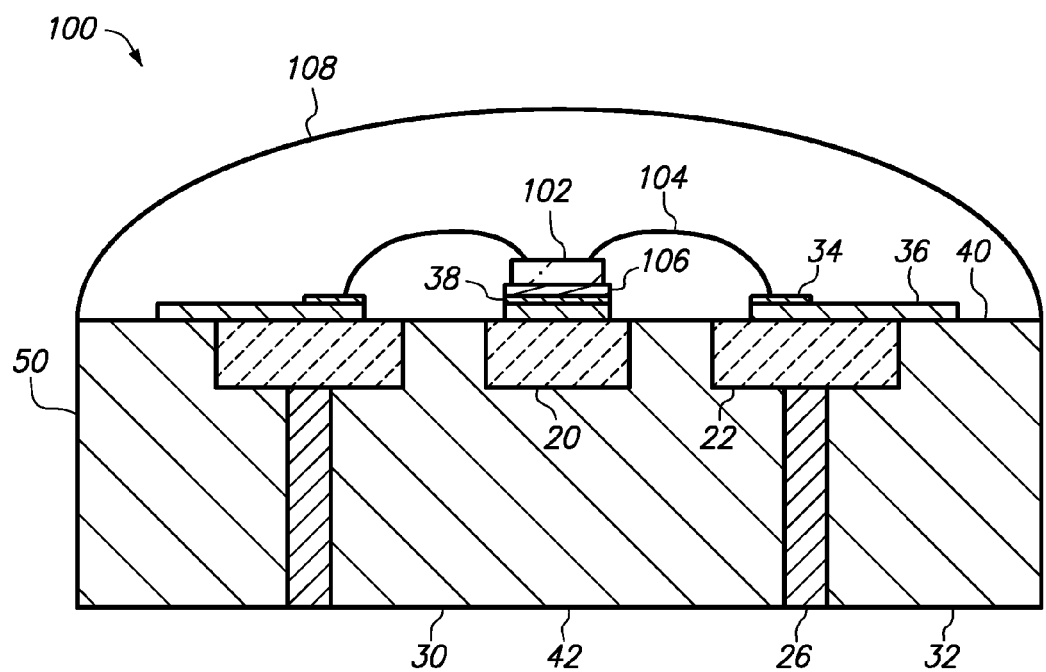
FIGS. 7A, 7B and 7C are cross-sectional, top and bottom views, respectively, of a semiconductor chip assembly that includes a substrate and a semiconductor device in accordance with an embodiment of the present invention.
Figure 7B:
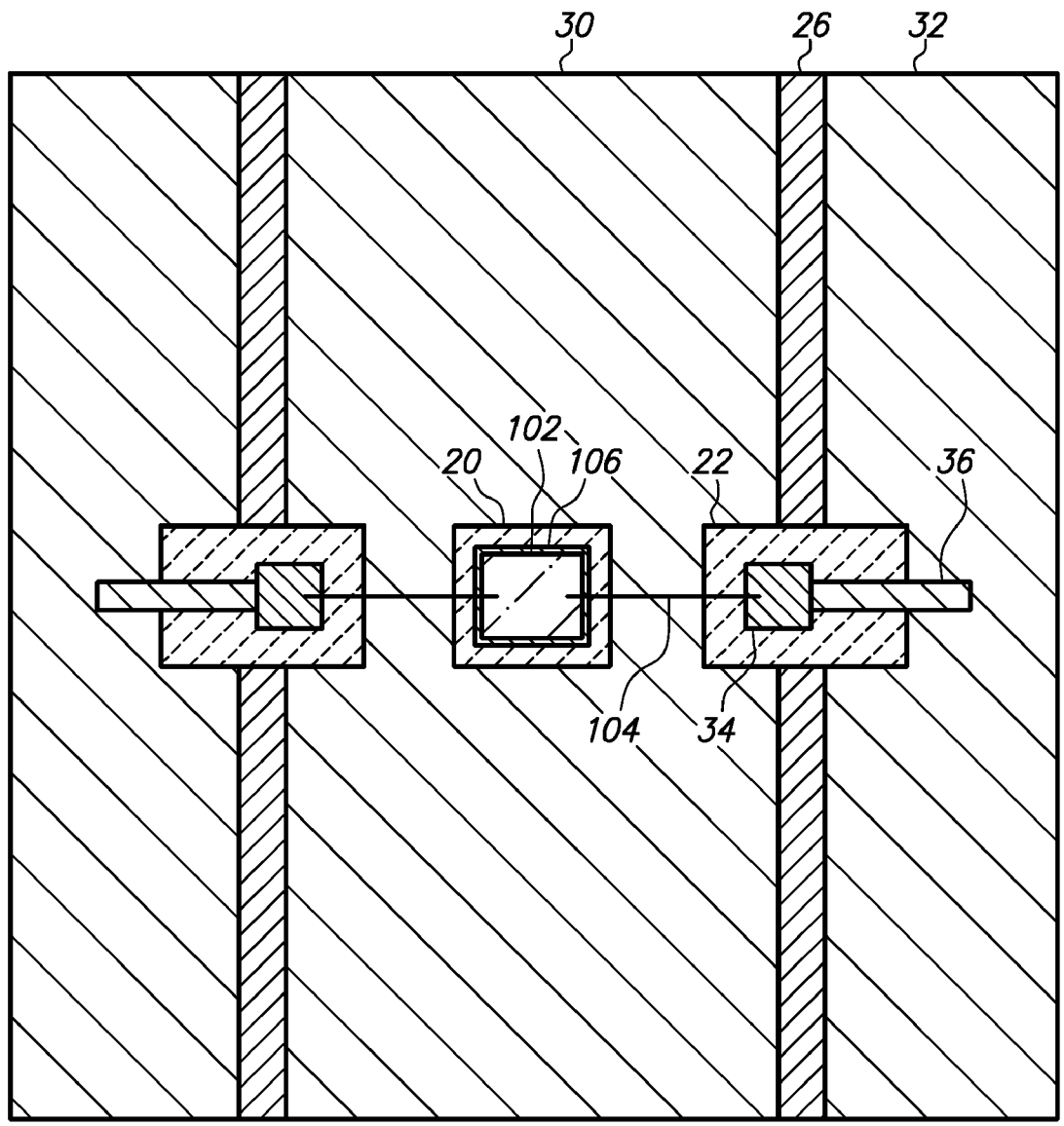
Figure 7C:
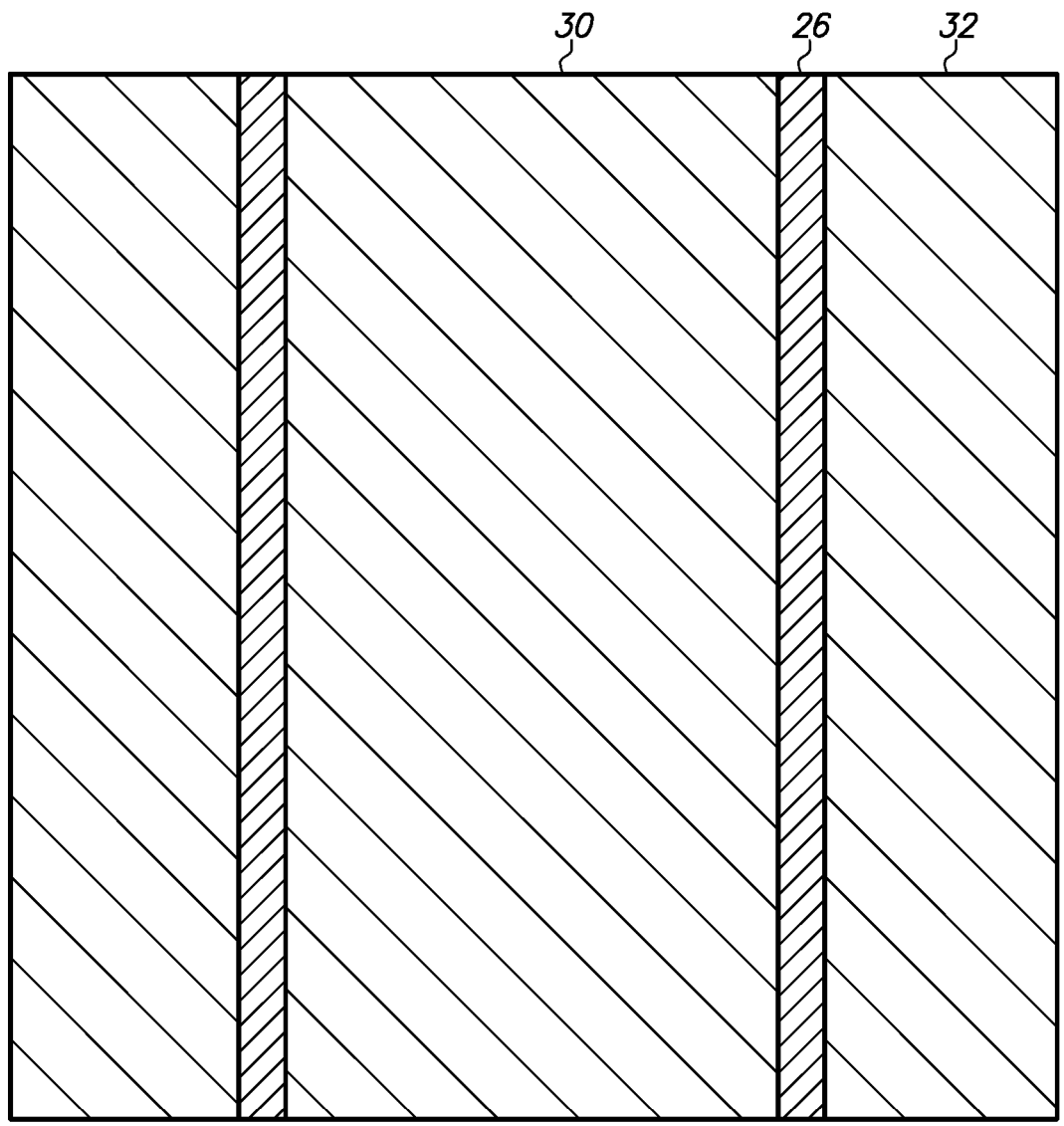

FIGS. 7A, 7B and 7C are cross-sectional, top and bottom views, respectively, of a semiconductor chip assembly that includes a substrate and a semiconductor device in accordance with an embodiment of the present invention. In this embodiment, the semiconductor device is a semiconductor chip that is mounted on the cap, is electrically connected to the pad using a wire bond and is thermally connected to the cap using a die attach.

Semiconductor chip assembly 100 includes substrate 50, chip 102, wire bond 104, die attach 106 and encapsulant 108. Chip 102 is mounted on and overlaps and is located within the peripheries of ceramic block 20 and cap 38, does not overlap ceramic block 22, insulative material 26 or conductive trace 40, is electrically connected to pad 34 by wire bond 104 and is thermally connected to and mechanically attached to cap 38 by die attach 106. As a result, chip 102 is electrically connected to terminal 32, electrically isolated from base 30 and thermally connected to base 30. Wire bond 104 is a gold wire and die attach 106 is a gold-tin eutectic. Encapsulant 108 is a solid adherent electrically insulative protective enclosure that provides environmental protection such as moisture resistance and particle protection for chip 102 and wire bond 104. Encapsulant 108 is transparent in FIG. 7B for convenience of illustration.

Semiconductor chip assembly 100 is manufactured by mounting chip 102 on cap 38 using die attach 106, then wire bonding chip 102 to pad 34 and then molding encapsulant 108 on the structure. Semiconductor chip assembly 100 is a first-level single-chip package.

The embodiments described above are merely exemplary. Numerous other embodiments are contemplated. In addition, the embodiments described above can be mixed-and-matched with one another and with other embodiments depending on design and reliability considerations.

The semiconductor chip can be optical or non-optical. For instance, the chip can be an LED, a solar cell, a microprocessor, a controller or an RF power amplifier. Likewise, the semiconductor package can be an LED package or an RF module. Thus, the semiconductor device can be a packaged or unpackaged optical or non-optical chip.

The conductive trace can include additional pads, terminals, vias and routing lines as well as passive components and have different configurations. Furthermore, the pad and the terminal can have a wide variety of packaging formats as required by the semiconductor device and the next level assembly.

The ceramic block can be various ceramics such as alumina, silicon carbide and aluminum nitride. Preferably, the ceramic block is a low temperature cofired ceramic (LTCC) with high thermal conductivity, high strength, low electrical conductivity and a low coefficient of thermal expansion ($3\text{-}15\times10^{-6}/°$ C.). Furthermore, an alumina ceramic can be pure alumina (aluminum oxide) but is typically an alumina composite that includes an additive such as glass, molybdenum, tungsten, magnesium oxide, silicon dioxide, calcium carbonate or combinations thereof and is at least 80% alumina.

The working format can be a single substrate or multiple substrates based on the manufacturing design. For instance, a single substrate can be manufactured individually. Alternatively, numerous substrates can be simultaneously batch manufactured using a single metal plate and then separated from one another.

Various changes and modifications to the embodiments described herein will be apparent to those skilled in the art. For instance, the materials, dimensions, shapes, sizes, steps and arrangement of steps described above are merely exemplary. Such changes, modifications and equivalents may be made without departing from the spirit and scope of the present invention as defined in the appended claims.

We claim:

1. A method of making a semiconductor chip assembly, comprising:
   providing a metal plate, wherein the metal plate includes a top surface that faces in an upward direction and a bottom surface that faces in a downward direction opposite the upward direction;
   forming a cavity in the metal plate, wherein the cavity extends to the top surface of the metal plate, is spaced from the bottom surface of the metal plate and faces in the upward direction;
   providing a ceramic block in the cavity;
   forming a slot in the metal plate, wherein the slot extends to the bottom surface of the metal plate;
   providing an insulative material in the slot;
   wherein the metal plate includes a base and a terminal, the slot provides edges of the base and the terminal that face towards one another, the cavity extends into the base, the ceramic block contacts and is embedded in the base in the cavity and the insulative material contacts and is sandwiched between the base and the terminal in the slot; then
   depositing a conductive layer on the base, the terminal and the ceramic block; then
   providing a conductive trace that includes a pad and the terminal, wherein the conductive trace includes a selected portion of the conductive layer;
   removing selected portions of the metal plate, thereby providing additional edges of the base and the terminal; then
   mounting a semiconductor device on the ceramic block, wherein a heat spreader includes the base and the ceramic block and the semiconductor device overlaps the ceramic block;
   electrically connecting the semiconductor device to the pad, thereby electrically connecting the semiconductor device to the terminal; and
   thermally connecting the semiconductor device to the ceramic block, thereby thermally connecting the semiconductor device to the base.

2. The method of claim 1, wherein providing the ceramic block includes:
   forming an etch mask on the metal plate that selectively exposes the metal plate and defines the cavity;
   etching the metal plate in a pattern defined by the etch mask, thereby forming the cavity in the metal plate; then
   removing the etch mask; and then
   providing the ceramic block in the cavity.

3. The method of claim 1, wherein providing the ceramic block includes depositing a slurry into the cavity and then sintering the slurry.

4. The method of claim 1, wherein the ceramic block contacts the insulative material and the terminal.

5. The method of claim 1, wherein the ceramic block is spaced from the insulative material and the terminal.

6. The method of claim 1, wherein providing the insulative material includes depositing an epoxy paste into the slot and then curing the epoxy paste.

7. The method of claim 1, including providing the ceramic block and then providing the insulative material.

8. The method of claim 1, including providing the insulative material and then providing the ceramic block.

9. The method of claim 1, wherein providing the conductive trace includes:
   grinding the metal plate and the ceramic block such that the metal plate and the ceramic block are laterally aligned with one another at a top lateral surface that faces in the upward direction; then
   depositing the conductive layer on the top lateral surface; and then
   removing selected portions of the conductive layer.

10. The method of claim 1, wherein mounting the semiconductor device includes providing a die attach between the semiconductor device and the ceramic block, electrically connecting the semiconductor device includes providing a wire bond between the semiconductor device and the pad, and thermally connecting the semiconductor device includes providing the die attach between the semiconductor device and the ceramic block.

11. A method of making a semiconductor chip assembly, comprising:

providing a metal plate, wherein the metal plate includes a top surface that faces in an upward direction and a bottom surface that faces in a downward direction opposite the upward direction;

forming a cavity in the metal plate, wherein the cavity extends to the top surface of the metal plate, is spaced from the bottom surface of the metal plate and faces in the upward direction;

providing a ceramic block in the cavity;

forming a slot in the metal plate, wherein the slot extends to the bottom surface of the metal plate;

providing an insulative material in the slot;

wherein the metal plate includes a base and a terminal, the slot provides edges of the base and the terminal that face towards one another, the cavity extends into the base, the ceramic block contacts and is embedded in the base in the cavity and the insulative material contacts and is sandwiched between the base and the terminal in the slot; then depositing a conductive layer on the base, the terminal and the ceramic block; then providing a conductive trace that includes a pad and the terminal, wherein the conductive trace includes a selected portion of the conductive layer;

providing a cap on the ceramic block, wherein the cap includes a selected portion of the conductive layer;

removing selected portions of the metal plate, thereby providing additional edges of the base and the terminal; then mounting a semiconductor device on the cap, wherein a heat spreader includes the base, the ceramic block and the cap and the semiconductor device overlaps the ceramic block and the cap;

electrically connecting the semiconductor device to the pad, thereby electrically connecting the semiconductor device to the terminal; and thermally connecting the semiconductor device to the cap, thereby thermally connecting the semiconductor device to the base.

12. The method of claim 11, wherein providing the ceramic block includes:

forming an etch mask on the metal plate that selectively exposes the metal plate and defines the cavity;

etching the metal plate in a pattern defined by the etch mask, thereby forming the cavity in the metal plate; then removing the etch mask; then depositing a slurry into the cavity; and then sintering the slurry, thereby providing the ceramic block in the cavity and embedding the ceramic block in the metal plate.

13. The method of claim 11, wherein providing the insulative material includes depositing an epoxy paste into the slot and then curing the epoxy paste.

14. The method of claim 11, wherein providing the conductive trace includes:

grinding the metal plate and the ceramic block such that the metal plate and the ceramic block are laterally aligned with one another at a top lateral surface that faces in the upward direction; then depositing the conductive layer on the top lateral surface; and then removing selected portions of the conductive layer using an etch mask that defines the pad and the cap.

15. The method of claim 11, wherein mounting the semiconductor device includes providing a die attach between the semiconductor device and the cap, electrically connecting the semiconductor device includes providing a wire bond between the semiconductor device and the pad, and thermally connecting the semiconductor device includes providing the die attach between the semiconductor device and the cap.

16. A method of making a semiconductor chip assembly, comprising:

providing a metal plate, wherein the metal plate includes a top surface that faces in an upward direction and a bottom surface that faces in a downward direction opposite the upward direction;

forming a first cavity in the metal plate, wherein the first cavity extends to the top surface of the metal plate, is spaced from the bottom surface of the metal plate and faces in the upward direction;

forming a second cavity in the metal plate, wherein the second cavity extends to the top surface of the metal plate, is spaced from the bottom surface of the metal plate and faces in the upward direction;

providing a first ceramic block in the first cavity;

providing a second ceramic block in the second cavity;

forming a slot in the metal plate, wherein the slot extends to the bottom surface of the metal plate;

providing an insulative material in the slot;

wherein the metal plate includes a base and a terminal, the slot provides edges of the base and the terminal that face towards one another, the first cavity extends into the base alone and is spaced from the slot, the second cavity extends into the base and the terminal and is adjacent to and overlaps the slot, the first ceramic block contacts and is embedded in the base alone in the first cavity, the second ceramic block contacts and is embedded in the base and the terminal in the second cavity and contacts the insulative material, and the insulative material contacts and is sandwiched between the base and the terminal in the slot; then depositing a conductive layer on the base, the terminal and the ceramic blocks; then providing a conductive trace that includes a pad and the terminal, wherein the conductive trace includes a selected portion of the conductive layer and contacts and overlaps the second ceramic block over the base, the terminal and the insulative material;

providing a cap that contacts and overlaps the first ceramic block, wherein the cap includes a selected portion of the conductive layer;

removing selected portions of the metal plate, thereby providing additional edges of the base and the terminal; then mounting a semiconductor device on the cap, wherein a heat spreader includes the base, the ceramic block and the cap and the semiconductor device overlaps the first ceramic block and the cap;

electrically connecting the semiconductor device to the pad, thereby electrically connecting the semiconductor device to the terminal; and thermally connecting the semiconductor device to the cap, thereby thermally connecting the semiconductor device to the base.

17. The method of claim 16, wherein providing the ceramic blocks includes:

forming an etch mask on the metal plate that selectively exposes the metal plate and defines the cavities;

etching the metal plate in a pattern defined by the etch mask, thereby forming the cavities in the metal plate; then removing the etch mask; then depositing a slurry into the cavities; and then sintering the slurry, thereby providing the ceramic blocks in the cavities and embedding the ceramic blocks in the metal plate.

18. The method of claim 16, wherein providing the insulative material includes depositing an epoxy paste into the slot and then curing the epoxy paste.

19. The method of claim 16, wherein providing the conductive trace includes:

grinding the metal plate and the ceramic blocks such that the metal plate and the ceramic blocks are laterally aligned with one another at a top lateral surface that faces in the upward direction; then depositing the conductive layer on the top lateral surface; and then removing selected portions of the conductive layer using an etch mask that defines the pad and the cap.

20. The method of claim 16, wherein mounting the semiconductor device includes providing a die attach between the semiconductor device and the cap, electrically connecting the semiconductor device includes providing a wire bond between the semiconductor device and the pad, and thermally connecting the semiconductor device includes providing the die attach between the semiconductor device and the cap.

* * * * *